(12) United States Patent
Sunamura et al.

(10) Patent No.: US 9,230,865 B2
(45) Date of Patent: Jan. 5, 2016

(54) SEMICONDUCTOR DEVICE AND MANUFACTURING METHOD THEREOF

(71) Applicant: Renesas Electronics Corporation, Kawasaki-shi, Kanagawa (JP)

(72) Inventors: Hiroshi Sunamura, Kanagawa (JP); Kishou Kaneko, Kanagawa (JP); Naoya Furutake, Kanagawa (JP); Shinobu Saitou, Kanagawa (JP); Yoshihiro Hayashi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/710,111

(22) Filed: May 12, 2015

(65) Prior Publication Data

US 2015/0243562 A1    Aug. 27, 2015

Related U.S. Application Data

(62) Division of application No. 13/972,804, filed on Aug. 21, 2013, now Pat. No. 9,082,643.

(30) Foreign Application Priority Data

Aug. 24, 2012 (JP) ................................ 2012-185332

(51) Int. Cl.
*H01L 21/8238* (2006.01)
*H01L 21/8234* (2006.01)
(Continued)

(52) U.S. Cl.
CPC ........ *H01L 21/8254* (2013.01); *H01L 21/8238* (2013.01); *H01L 29/7869* (2013.01)

(58) Field of Classification Search
CPC ..... H01L 33/00; H01L 29/786; H01L 21/336; H01L 27/092; H01L 21/823857; H01L 21/8238; H01L 21/00; H01L 21/8254
USPC ...................... 257/43, 59, E21.414, E29.068, 257/E33.053, E29.291, E29.296, E21.477, 257/E21.409; 438/104, 158, 212, 306, 85, 438/86, 238
See application file for complete search history.

(56) References Cited

U.S. PATENT DOCUMENTS 8,378,341 B2   2/2013  Hayashi et al.
2002/0005583 A1*  1/2002  Harada et al. ................. 257/758
(Continued)

FOREIGN PATENT DOCUMENTS

JP   2010-141230 A   6/2010
WO  2010/010802 A1  1/2010

OTHER PUBLICATIONS

Kaneko, K. et.al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, pp. 123-124 (2012).

(Continued)

*Primary Examiner* — Amar Movva
*Assistant Examiner* — Sheikh Maruf
(74) *Attorney, Agent, or Firm* — Miles & Stockbridge P.C.

(57) ABSTRACT

A semiconductor device is provided which includes an N-type semiconductor layer and a P-type semiconductor layer coexisting in the same wiring layer without influences on the properties of a semiconductor layer. The semiconductor device includes a first wiring layer with a first wiring, a second wiring layer with a second wiring, and first and second transistors provided in the first and second wiring layers. The first transistor includes a first gate electrode, a first gate insulating film, a first oxide semiconductor layer, a first hard mask layer, and first insulating sidewall films covering the sides of the first oxide semiconductor layer. The second transistor includes a second gate electrode, a second gate insulating film, a second oxide semiconductor layer, and a second hard mask layer.

4 Claims, 23 Drawing Sheets

(51) Int. Cl.
  *H01L 21/00*    (2006.01)
  *H01L 21/8254*  (2006.01)
  *H01L 29/786*   (2006.01)

(56) References Cited

U.S. PATENT DOCUMENTS

| | | | |
|---|---|---|---|
| 2002/0125577 A1* | 9/2002 | Komada | 257/774 |
| 2006/0186441 A1* | 8/2006 | Takayama et al. | 257/257 |
| 2008/0073711 A1* | 3/2008 | Murata et al. | 257/334 |
| 2008/0122098 A1* | 5/2008 | Kajimoto et al. | 257/759 |
| 2009/0242992 A1* | 10/2009 | Kim et al. | 257/360 |
| 2010/0051936 A1* | 3/2010 | Hayashi et al. | 257/43 |
| 2010/0065837 A1* | 3/2010 | Omura et al. | 257/43 |
| 2010/0148171 A1* | 6/2010 | Hayashi et al. | 257/43 |
| 2010/0301326 A1* | 12/2010 | Miyairi et al. | 257/43 |
| 2012/0001243 A1* | 1/2012 | Kato | 257/296 |
| 2012/0025394 A1* | 2/2012 | Hirano et al. | 257/774 |
| 2012/0074520 A1* | 3/2012 | Yang et al. | 257/529 |

OTHER PUBLICATIONS

Kaneko, K. et.al., "A Novel BEOL-Transistor (BETr) with InGaZnO Embedded in Cu-Interconnects for On-chip High Voltage I/Os in Standard CMOS LSIs", 2011 Symposium on VLSI Technology Digest of Technical Papers, pp. 120-121 (2011).

Kaneko, K. et.al., "Highly Reliable BEOL-Transistor with Oxygen-controlled InGaZnO and Gate/Drain Offset Design for High/Low Voltage Bridging I/O Operations", 2011 IEEE International Electron Devices Meeting (IEDM), pp. 155-158 (2011).

Ogo, Yoichi et.al., "p-channel thin-film transistor using p-type oxide semiconductor, SnO", Appl.Phys.Lett.93, 032113 (2008).

Yabuta, Hisato et.al., "Sputtering formation of p-type SnO thin-film transistors on glass toward oxide complimentary circuits", Appl. Phys.Lett.97, 072111 (2010).

* cited by examiner

FIG. 6

| STEP | B | | A | |
|---|---|---|---|---|
| | NMOS | PMOS | NMOS | PMOS |
| NMOS-HM | 100nm | | 100nm | |
| NMOS PROCESS | 60nm | | 60nm | |
| ELEMENT ISOLATION | 60+50nm | | 60nm | |
| PMOS-HM | 110nm | 100nm | 60nm | 100nm |
| PMOS PROCESS | 110nm | 60nm | 60nm | 60nm |
| ILD DEPOSITION | 110+200nm | 60+200nm | 60+200nm | 60+200nm | ized
SEMICONDUCTOR DEVICE AND MANUFACTURING METHOD THEREOF

CROSS-REFERENCE TO RELATED APPLICATIONS

The disclosure of Japanese Patent Application No. 2012-185332 filed on Aug. 24, 2012 including the specification, drawings and abstract is incorporated herein by reference in its entirety.

BACKGROUND

The present invention relates to semiconductor devices, and more specifically, to a technique that can be suitably applied to a semiconductor device, for example, with an active element in a wiring layer.

There have been known techniques for providing an active element in a wiring layer of a semiconductor device. Such a semiconductor device can switch its function by use of the active element without changing the layout of semiconductor elements formed at a semiconductor substrate. Thus, the technique can manufacture a plurality of types of semiconductor devices with different functions using the semiconductor substrate with the same layout of the semiconductor elements over the substrate. In this case, the manufacturing costs of the semiconductor devices can be reduced.

For example, Japanese Unexamined Patent Publication No. 2010-141230 discloses a semiconductor device and a manufacturing method thereof. The semiconductor device includes a semiconductor substrate, a first wiring layer, a semiconductor layer, a gate insulating film, and a gate electrode. The first wiring layer includes an insulating layer formed over the semiconductor substrate, and a first wiring embedded in the surface of the insulating layer. The semiconductor layer is positioned over the first wiring layer. The gate insulating film is positioned above or below the semiconductor layer. The gate electrode is positioned on the opposite side to the semiconductor layer via the gate insulating film. At this time, the semiconductor layer, the gate insulating film, and the gate electrode form a transistor as the active element. For example, one first wiring can be used as the gate insulating film. Specifically, a cap insulating film for preventing the diffusion of the first wiring layer can be used as the gate insulating film. In that case, the gate insulating film is formed under the semiconductor layer.

In order to reduce power consumption (save power) of the active element in the wiring layer as described above, it is effective to use a CMOS inverter. This is because the use of the CMOS inverter as a switch can suppress the flow-through current through the inverter. The CMOS inverter includes a P-type MOS transistor and an N-type MOS transistor in the same wiring layer. In this case, both a P-type semiconductor layer and an N-type semiconductor layer which are made of different materials are required to be provided in the same wiring layer.

When using the technique disclosed in the above Japanese Unexamined Paten Publication No. 2010-141230, specifically, the following structure can be proposed. The active element, that is, the CMOS inverter in the wiring layer, includes the P-type MOS transistor and the N-type MOS transistor. In each of the MOS transistors, one first wiring in the first wiring layer serves as the gate electrode, the cap insulating film for preventing the diffusion over first wiring layer serves as the gate insulating film, and a semiconductor layer is provided in a predetermined shape over the cap insulating film. The P-type semiconductor layer and the N-type semiconductor layer are disposed spaced apart from each other. Both layers are embedded in an interlayer insulating layer.

In the related art, Non-Patent Document 1 (2012 Symposium on VLSI Technology Digest of Technical Papers, 123-124(2012)) discloses an inverter circuit using an oxide semiconductor layer. Non-Patent Document 2 (2011 Symposium on VLSI Technology Digest of Technical Papers, 120-121 (2011)) discloses a LSI incorporating an oxide semiconductor layer in a multilayer wiring layer. Further, Non-Patent Document 3 (2011 IEEE International Electron Devices Meeting (IEDM), 155-158(2011)) discloses a transistor device structure using an oxide semiconductor layer.

PCT Patent Publication WO 2010/010802, Non-Patent Document 4 (Appl. Phys. Lett. 93,032113(2008)), and Non-Patent Document 5 (Appl. Phys. Lett. 97,072111(2010)) discloses a p-channel thin film transistor. The p-channel thin film transistor (field-effect transistor) includes a thin film made of stannous oxide (SnO) deposited as a channel layer over a substrate of the thin film transistor. A source/drain electrode is formed using a laminated film of Ni/Au or a Pt film.

RELATED ART DOCUMENTS

Patent Documents

[Patent Document 1]
Japanese Unexamined Patent Publication No. 2010-141230
[Patent Document 2]
WO2010/010802

Non-Patent Documents

[Non-Patent Document 1]
K. Kaneko et. al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, 123-124 (2012).
[Non-Patent Document 2]
K. Kaneko et. al., "A Novel BEOL-Transistor (BETr) with InGaZnO Embedded in Cu-Interconnects for On-chip High Voltage I/Os in Standard CMOS LSIs", 2011 Symposium on VLSI Technology Digest of Technical Papers, 120-121 (2011).
[Non-Patent Document 3]
K. Kaneko et. al., "High Reliable BEOL-Transistor with Oxygen-controlled InGaZnO and Gate/Drain Offset Design for High/Low Voltage Bridging I/O Operations", 2011 IEE International Electron Devices Meeting (IEDM), 155-158 (2011).
[Non-Patent Document 4]
Yoichi Ogo, et. al., "p-channel thin-film transistor using p-type oxide semiconductor, SnO", Appl. Phys. Lett. 93,032113 (2008).
[Non-Patent Document 5]
Hisato Yabuta, et. al., "Sputtering formation of p-type SnO thin-film transistors on glass toward oxide complimentary circuits", Appl. Phys. Lett. 97,072111 (2010).

SUMMARY

In the above CMOS inverter using the technique disclosed in Japanese Unexamined Patent Publication No. 2010-141230, individual manufacturing processes for the P-type semiconductor layer and the N-type semiconductor layer are very important because the P-type and N-type semiconductor layers are formed of different materials in the same wiring layer. The individual manufacturing processes involve first forming one type (for example, P-type) of semiconductor layer, and then forming the other type (for example, N-type) of semiconductor layer. The individual manufacturing processes will be specifically described below.

First, a P-type semiconductor film and a hard mask for a P-type semiconductor layer are laminated over a cap insulating film in that order. Then, the P-type semiconductor film and the P hard mask are etched into a desired shape. In this way, a P-type semiconductor layer with its surface covered with the P hard mask is formed. The P-type semiconductor layer has its side exposed to the outside. Subsequently, an N-type semiconductor film and a hard mask for an N-type semiconductor layer are laminated in that order over an element isolation insulating film and the P hard mask. Then, the N-type semiconductor film and the N hard mask are etched into a desired shape. In this way, an N-type semiconductor layer with its surface covered with the N hard mask is formed.

In the above process, when depositing the N-type semiconductor film, the side of the P-type semiconductor layer under the P hard mask is partly exposed. Thus, the N-type semiconductor film might be brought into contact with the side of the P-type semiconductor layer. As a result, the material of the P-type semiconductor film might possibly be diffused into the N-type semiconductor layer, or the material of the N-type semiconductor layer might possibly be diffused into the P-type semiconductor film, which would degrade or modify the properties of the P-type semiconductor layer. The same goes for the structure of a combination of the N-type semiconductor layer and the P-type semiconductor layer which are formed in the reversed order. Techniques are required to form both the N-type semiconductor layer and the P-type semiconductor layer in the same wiring layer without influences on the properties of the semiconductor layer.

Other problems and new features of the present invention will be better understood after a reading of the following detailed description of the present specification in connection with the accompanying drawings.

According to one embodiment of the present invention, an insulating film is provided at one of the N-type semiconductor layer and the P-type semiconductor layer to cover the sides of the semiconductor layer (and hard mask layer).

In the one embodiment of the present invention, the N-type semiconductor layer and the P-type semiconductor layer can be provided together in the same wiring layer without influences on the properties of the semiconductor layer.

BRIEF DESCRIPTION OF DRAWINGS

FIG. 6 is a table showing differences between the structure of this embodiment and the structure shown in FIG. 5D;

DETAILED DESCRIPTION

Now, a semiconductor device and a manufacturing method thereof according to some preferred embodiments of the present invention will be described below with reference to the accompanying drawings.

First Embodiment

Figure 1A:
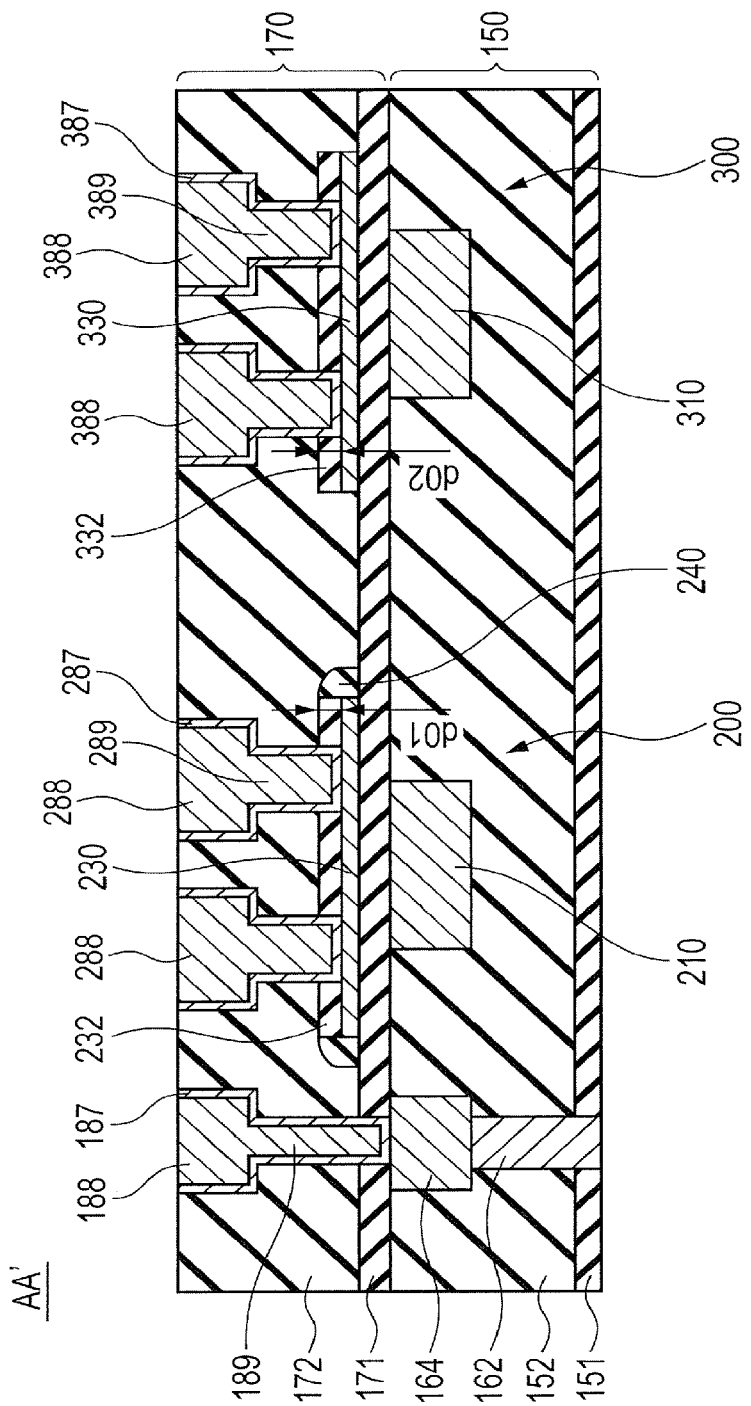
FIG. 1A is a cross-sectional view showing the structure of a semiconductor device according to a first embodiment of the present invention.
Figure 1B:
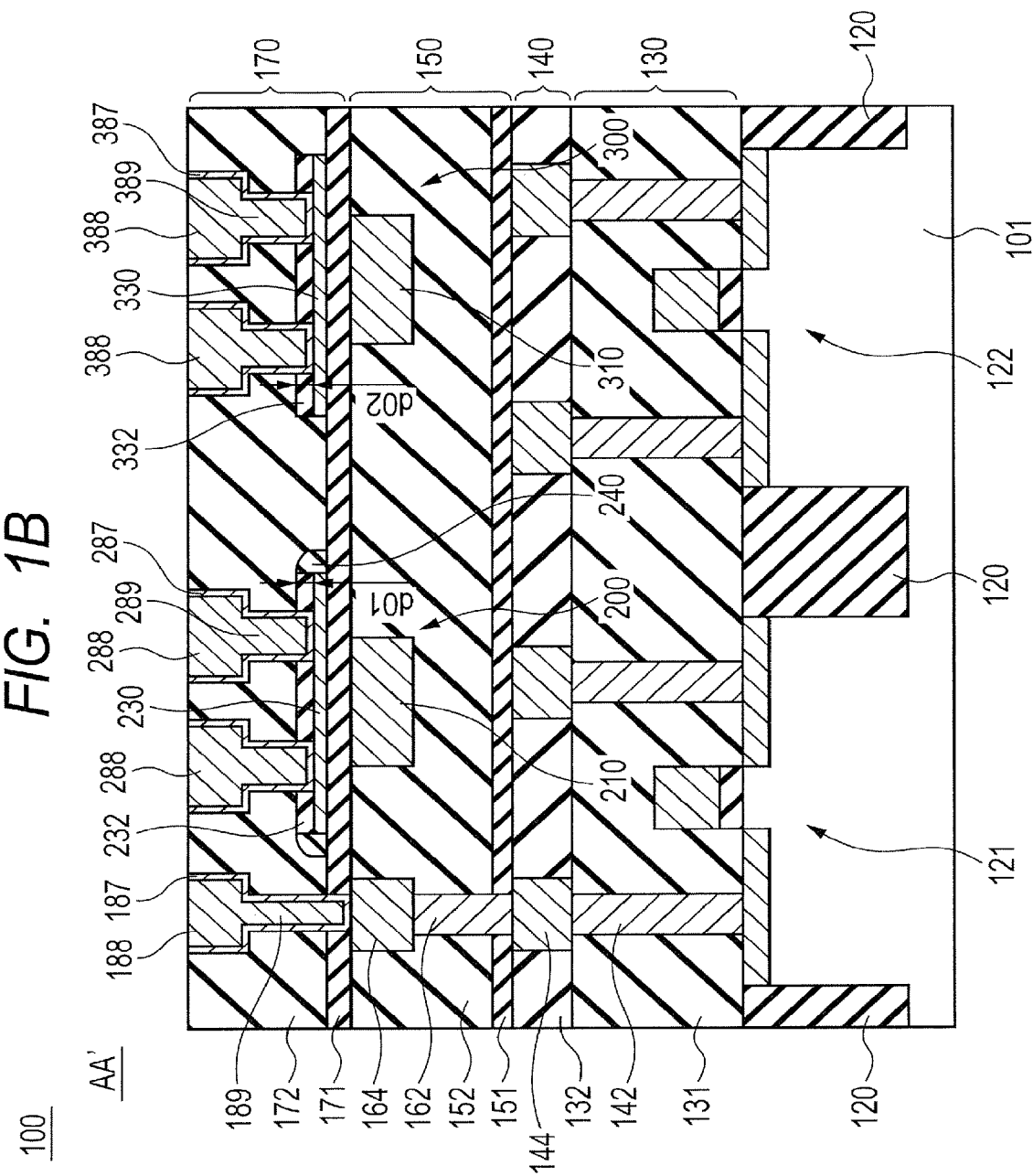
FIG. 1B is another cross-sectional view showing the structure of the semiconductor device according to the first embodiment.
Figure 2:
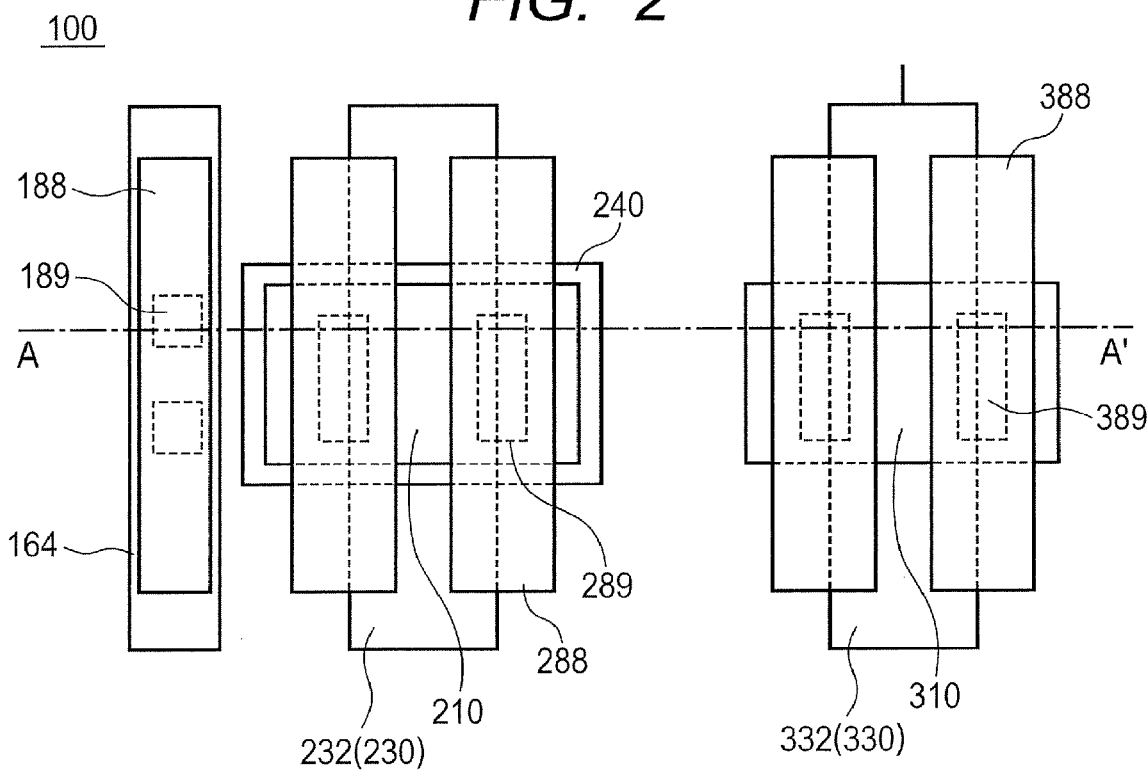
FIG. 2 is a plan view showing the structure of the semiconductor device in the first embodiment.

The structure of a semiconductor device in a first embodiment of the invention will be described below. FIGS. 1A, 1B, and 2 are cross-sectional views and a plan view showing the structure of the semiconductor device in this embodiment. FIGS. 1A and 1B are cross-sectional views taken along the line A-A' of FIG. 2. FIG. 1A shows a main part of FIG. 1B.

A semiconductor device 100 of this embodiment includes a first wiring layer 150, a second wiring layer 170, a first transistor 200, and a second transistor 300. The first wiring layer 150 includes a first interlayer insulating layer 152, and a first wiring 164 (210, 310) embedded in the surface of the first interlayer insulating layer 152. The second wiring layer 170 is formed over the first wiring layer 150. The second wiring layer 170 includes a cap insulating layer 171 covering the first wirings 164, 210, and 310 and the first interlayer insulating layer 152, a second interlayer insulating layer 172, and second wirings 188, 289, and 389 embedded in the second interlayer insulating layer 172. The first transistor 200 is provided in the first wiring layer 150 and the second wiring layer 170, and is of a first conductive type (for example, P-type). The second transistor 300 is provided in the first wiring layer 150 and the second wiring layer 170, and is of a second conductive type (for example, N-type) other than the first conductive type.

The first transistor 200 includes a first gate electrode 210, the first gate insulating film (171), a first oxide semiconductor layer 230, a first hard mask 232, and first sidewalls 240. The first gate electrode 210 is one of the first wirings. The first gate insulating film (171) is provided over the first gate electrode 210, and includes a part of the cap insulating layer 171. The first oxide semiconductor layer 230 is provided over the first gate insulating film (171). The first hard mask 232 is provided over the first oxide semiconductor layer 230. Each first sidewall 240 is provided aside from the second interlayer insulating layer 172 to cover the side of the first oxide semiconductor layer 230 to exhibit insulating properties. The second transistor 300 includes the second gate electrode 310, a second gate insulating film (171), a second oxide semiconductor layer 330, and a second hard mask 332. The second gate electrode 310 is the other of the first wirings. The second gate insulating film (171) is provided over the second gate electrode 310 to be coupled to the first gate insulating film (171), including another part of the cap insulating layer (171). The second oxide semiconductor layer 330 is provided over the second insulating film (171). The second hard mask 332 is provided over the second oxide semiconductor layer. The first transistor 200 and the second transistor 300 are transistors of opposite conductive types to form a complementary metal-oxide semiconductor (CMOS).

With this arrangement, the first oxide semiconductor layer 230 under the first hard mask 232 previously has its sides covered with the first sidewalls 240 when depositing the second oxide semiconductor layer 330. Thus, the first oxide semiconductor layer 230 is not in contact with the side of the second oxide semiconductor layer 330. As a result, there is no possibility that the first oxide semiconductor layer 230 modifies and degrades its properties due to dispersion of the material of the first oxide semiconductor layer 230 into the second oxide semiconductor layer 330, or dispersion of the material of the second oxide semiconductor layer 330 into the first oxide semiconductor layer 230. Thus, the N-type semiconductor layer and the P-type semiconductor layer can coexist together in the same wiring layer without any influences on properties of each oxide semiconductor layer. The insulating film over the first oxide semiconductor layer 230 is one layer of the first hard mask 232 (having a thickness d01). Likewise, the insulating film over the second oxide semiconductor layer 330 is also one layer of the second hard mask 332 (having a thickness d02), which can easily make the thicknesses of both layers substantially the same. Contact holes for the source and drain electrodes can be formed by etching in the same etching time. Thus, the contact characteristics of the respective oxide semiconductor layers can be substantially the same.

Now, the semiconductor device 100 in the first embodiment of the invention will be further described below.

The semiconductor device 100 further includes a semiconductor substrate 101, a contact layer 130 provided over the semiconductor substrate 101, and a wiring layer 140 provided over the contact layer 130. The semiconductor substrate 101 is provided with semiconductor elements, such as a transistor or a capacity element. In an example shown, transistors 121 and 122 are formed. The transistors 121 and 122 are separated by an element isolation layer 120. The contact layer 130 includes an interlayer insulating layer 131 provided over the semiconductor substrate 101, and contacts (source/drain electrode) 142 embedded in the interlayer insulating layer. The wiring layer 140 includes an interlayer insulating layer 132 provided over the interlayer insulating layer 131, and wirings 144 embedded therein. The source/drain of each of the transistors 121 and 122 is coupled to the wiring 144 via the contact (source/drain electrode) 142.

The first wiring layer 150 includes a cap insulating layer 151 provided over the wiring layer 140, and a first interlayer insulating layer 152 provided over the cap insulating layer 151. The wiring layer 150 further includes a via 162, and the first wiring 164 in addition to the above first gate electrode 210 and the second gate electrode 310 provided over the surface of a first interlayer insulating layer 152. The via 162 has its lower end penetrating the cap insulating layer 151 to be coupled to the wiring 144, and its upper end coupled to the first wiring 164. The first wiring 164 is provided on the front side of the first interlayer insulating layer 152. The first wiring 164, the first gate electrode 210, and the second gate electrode 310 are provided in the same first wiring layer 150.

The second wiring layer 170 includes the cap insulating layer 171 provided over the first wiring layer 150, and the second interlayer insulating layer 172 provided over the cap insulating layer 171. The second wiring layer 170 further includes a via 189, and the second wiring 188. The via 189 has its lower end penetrating the cap insulating layer 171 to be coupled to the first wiring 164, and its upper end coupled to the second wiring 188. The second wiring 188 is provided on the front side of the second interlayer insulating layer 172. The figure shows an example of the via 189 and the second wiring 188 of a dual damascene structure.

The second wiring layer 170 further includes the first oxide semiconductor layer 230 provided over the cap insulating layer 171, the first hard mask 232 provided over the first oxide semiconductor layer 230, and the sidewalls 240 provided around the laminated structure of the first oxide semiconductor layer 230 and the first hard mask 232. Thus, the first gate electrode 210, the cap insulating layer 171 as the gate insulating film, and the first oxide semiconductor layer 230 form the first transistor 200. The second wiring layer 170 further includes the contact (source/drain electrode) 289, and the second wiring 288. The contact 289 has its lower end penetrating the first hard mask 232 to be coupled to the first oxide semiconductor layer 230, and its upper end coupled to the second wiring 288. The second wiring 288 is provided on the front side of the second interlayer insulating layer 172. The figure shows an example of the contact 289 and the second wiring 288 of the dual damascene structure.

Likewise, the second wiring layer 170 further includes the second oxide semiconductor layer 330 provided over the cap insulating layer 171, and the second hard mask 332 provided over the second oxide semiconductor layer 330. Thus, the second gate electrode 310, the cap insulating layer 171 as the gate insulating film, and the second oxide semiconductor layer 330 form the second transistor 300. The second wiring layer 170 further includes the contact (source/drain electrode) 389, and a second wiring 388. The contact 389 has its lower end penetrating the second hard mask 332 to be coupled to the second oxide semiconductor layer 330, and its upper end coupled to the second wiring 388. The second wiring 388 is provided on the front side of the second interlayer insulating layer 172. The figure shows an example of the contact 389 and the second wiring 138 of the dual damascene structure.

As mentioned above, the first transistor 200 and the second transistor 300 form the CMOS in the wiring layer. The CMOS (each of transistors 200 and 300) is formed across the first wiring layer 150 including the first wirings as the gate electrodes 210 and 310, and the second wiring layer 170 including channels (the oxide semiconductor layers 230 and 330) and source/drain electrodes (the contacts 289 and 389).

In other words, the first transistor 200 of one conductive type includes the first oxide semiconductor layer 230 as the channel, whereas the second transistor 300 of the other opposite conductive type includes the second oxide semiconductor layer 330 as the channel. Each of the transistors includes the first wiring (Cu wiring) formed in the first wiring layer 150 as the gate electrode 210 or 310, and a cap insulating layer 160 as the gate insulating film. The sidewalls 240 are formed over both side walls of the first oxide semiconductor layer 230 as the channel of the first transistor 200 and the first hard mask 232. Each sidewall 240 serves as an element isolation film between the adjacent transistors. The sidewall 240 has only to cover at least the side wall of the first oxide semiconductor layer 230 even if the sidewall 240 does not cover the side of the first hard mask 232.

The via 189 is formed in the second wiring layer 170 to establish electrical coupling to the first wiring (Cu wiring) 14 thereunder. At the same time, the contact 289 electrically coupled to the first oxide semiconductor layer 230 is formed via the first hard mask 232, which serves as the source/drain electrode of the first transistor 200. Further, simultaneously, the contact 389 electrically coupled to the second oxide semiconductor layer 330 is formed via the second hard mask 332, which serves as the source/drain electrode of the second transistor 300. The combinations of the N-type and P-type transistors may include: the N-type first transistor 200 and the P-type second transistor 300; and the P-type first transistor 200 and the N-type second transistor 300. The first transistor 200 and the second transistor 300 are coupled in series, and the first gate electrode 210 and the second gate electrode 310 are electrically coupled together, which forms the CMOS inverter. In this embodiment, a Cu wiring is used for the first wiring 164. This embodiment is not limited to the above example. Alternatively, an Al wiring can be applied in the same way.

The CMOS inverter may be coupled to the semiconductor elements (for example, transistors 121 and 122) over the semiconductor substrate 101, for example, via the second wiring 188, the via 189, the first wiring 164, the via 162, the wiring 144, and the contact 142. By turning on the CMOS inverter, the semiconductor elements over the semiconductor substrate 101 can achieve different functions to each other using the semiconductor substrate without changing the layout of the semiconductor elements.

Next, a manufacturing method of the semiconductor device in this embodiment will be specifically described below. FIGS. 3A to 3M show cross-sectional views of the manufacturing method of the semiconductor device in this embodiment. Each of FIGS. 3A to 3M corresponds to the cross section taken along the line A-A' of FIG. 2. FIGS. 3A to 3M omit the illustration of the semiconductor substrate 101, the contact layer 130, and the wiring layer 140.

Figure 3A:
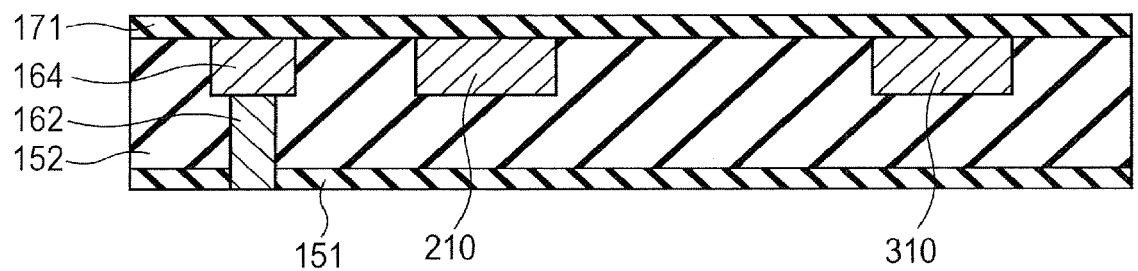
FIG. 3A is a cross-sectional view showing a step of a manufacturing method of the semiconductor device in the first embodiment.
Figure 3B:
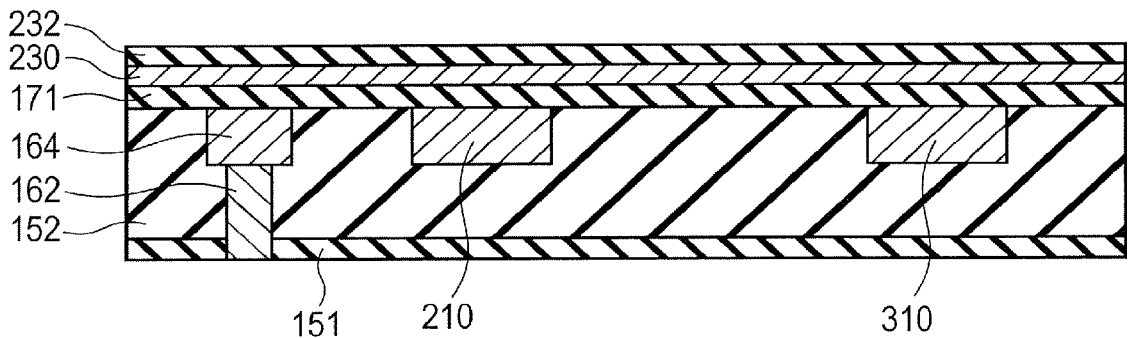
FIG. 3B is a cross-sectional view showing another step of the manufacturing method of the semiconductor device in the first embodiment.
Figure 3C:
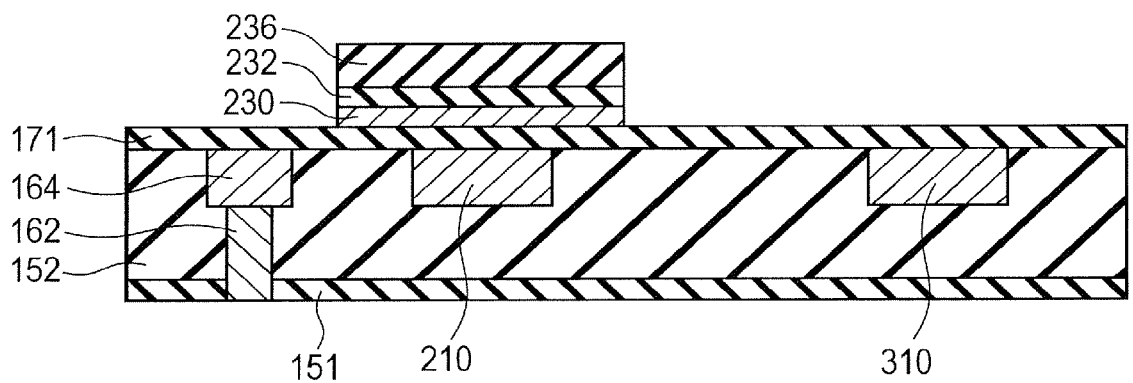
FIG. 3C is a cross-sectional view showing another step of the manufacturing method of the semiconductor device in the first embodiment.
Figure 3D:
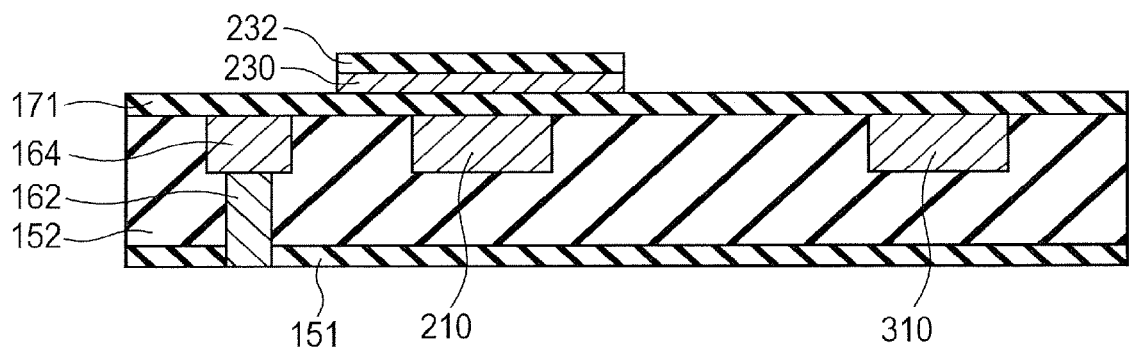
FIG. 3D is a cross-sectional view showing another step of the manufacturing method of the semiconductor device in the first embodiment.
Figure 3E:
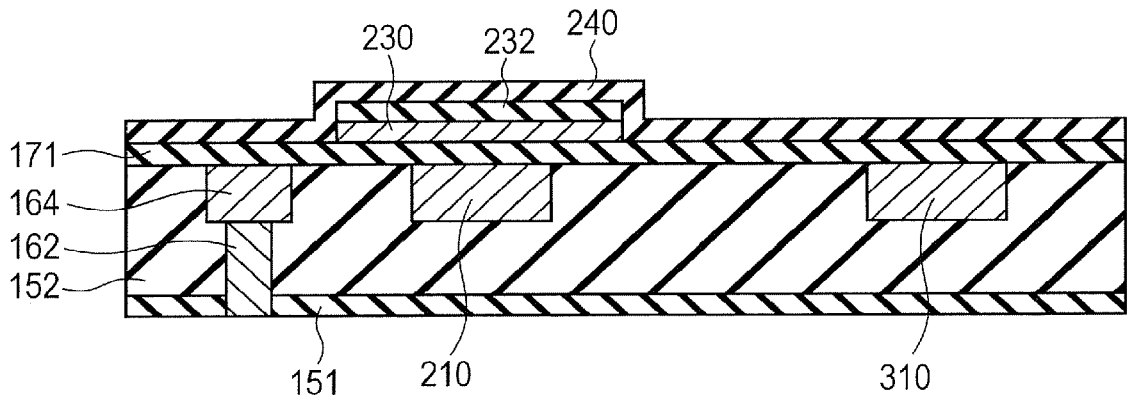
FIG. 3E is a cross-sectional view showing another step of the manufacturing method of the semiconductor device in the first embodiment.
Figure 3F:
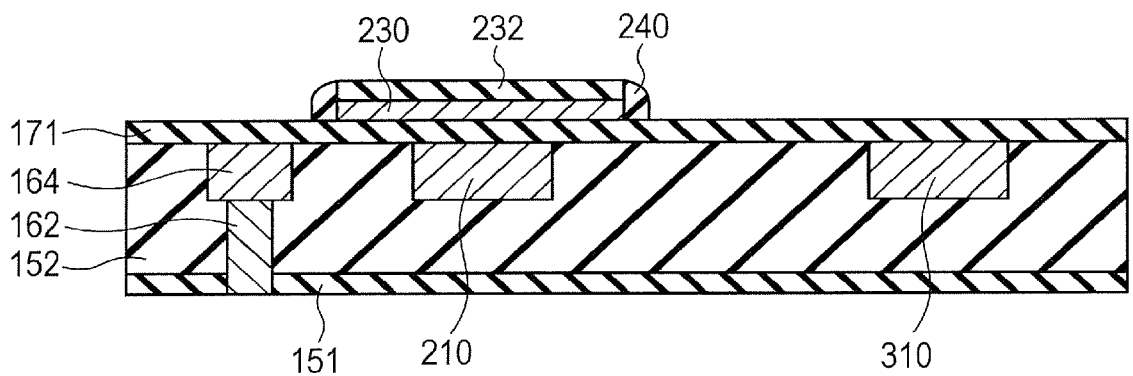
FIG. 3F is a cross-sectional view showing another step of the manufacturing method of the semiconductor device in the first embodiment.

As shown in FIG. 3A, first, the cap insulating layer 171 serving as the first gate insulating film (171) and the second gate insulating film (171) is formed in contact with the first gate electrode 210 and the second gate electrode 310 over the first wiring layer 150 with the first wiring including the first gate electrode 210 and the second gate electrode 310 formed thereover. Then, as shown in FIGS. 3B to 3D, a first laminated structure (230+232) of the first oxide semiconductor layer 230 of the first conductive type and the first hard mask layer 232 is formed over the first gate electrode 210 via the cap insulating layer 171. Subsequently, as shown in FIG. 3E, an insulating film (240) is formed to cover the first laminated structure (230+232) and the cap insulating film 171. Thereafter, as shown in FIG. 3F, the insulating film (240) is etched back to form the first sidewall film 240 covering each side of the first oxide semiconductor layer 230. Then, a second laminated structure (330+332) of the second hard mask layer 332 and the second oxide semiconductor layer 330 of the second conductive type other than the first conductive type is formed over the second gate electrode 310 via the cap insulating layer 171. Subsequently, the interlayer insulating film (172) is formed to cover the first laminated structure (230+232) and the second laminated structure (330+332). Thereafter, the source and drain electrodes (289 and 389) are formed to be coupled to the respective first oxide semiconductor layer 230 and second oxide semiconductor layer 330 via the interlayer insulating layer 172, the first hard mask 232, and the second hard mask 332.

In this embodiment, as shown in the steps of FIGS. 3E and 3F, the sidewalls 240 are formed over the sides of the first transistor 200 and the first hard mask 232. The sidewall 240 covers each side of the exposed first oxide semiconductor layer 230, which isolates the first oxide semiconductor layer 230 from the second oxide semiconductor layer 330 physically, chemically, and electrically. Such a function of the sidewall 240 as the element isolation film can prevent the modification and degradation of the first oxide semiconductor layer 230 due to the presence of the second oxide semiconductor layer 330 in the previous and following steps.

Additionally, in this embodiment, the above element isolation film is formed not of a coated insulating film itself (to be described later) covering the entire first laminated structure (230+232) but the sidewalls 240 formed by etching back the coated insulating film. Thus, after the "element isolation step", there is no difference in thickness of the combination of the hard mask and the coated insulating film between a part located on the first oxide semiconductor layer 230 and a part located on the second oxide semiconductor layer 330. This can suppress the excessive etching of one of the part over the first oxide semiconductor layer 230 and the part over the second oxide semiconductor layer 330 in dry etching for formation of the contact holes, which eliminates the case where one oxide semiconductor layer is removed as a whole. As a result, this embodiment can result in preventing the decrease in yield of the formation of the CMOS including the active elements in the wiring layers due to a contact defect.

Now, the manufacturing method of the semiconductor device 100 in this embodiment will be further described below.

First, as shown in FIG. 2, the element isolation layer 120 is formed at the semiconductor substrate 101. Then, the semiconductor elements, for example, the transistors 121 and 122 are formed over the semiconductor substrate 101. Subsequently, the contact layer 130 (including the interlayer insulating layer 131 and the contact 142), and the wiring layer 140 (including the interlayer insulating layer 132 and the wiring 144) are formed. The related-art methods can be used in these steps.

Then, as shown in FIG. 3A, the cap insulating layer 151 for prevention of the Cu diffusion, and the first interlayer insulating layer 152 are deposited over the wiring layer 140 (not shown) in that order. Suitable materials for the cap insulating layer 151 include a silicon nitride (SiN) and silicon carbon nitride (SiCN). The first interlayer insulating layer 152 is a low-dielectric insulating layer made of silicon oxide ($SiO_2$) or material having a dielectric constant lower than that of silicon oxide. The first interlayer insulating layer can be a carbon-containing film, such as a SiOC(H) film or a SiLK (registered trademark). Subsequently, the via 162, the first wiring 164, the first gate electrode 210, and the second gate electrode 310 are embedded in the first interlayer insulating layer 152 by a single damascene method or a dual damascene method. In this way, the first wiring layer 150 is formed. Suitable materials for the via 162, the first wiring 164, the first gate electrode 210, and the second gate electrode 310 can include, for example, copper (Cu). Therefore, the cap insulating layer 171 is formed to cover the first interlayer insulating layer 152, the first wiring 164, the first gate electrode 210, and the second gate electrode 310. Suitable materials for the cap insulating layer 171 include a silicon nitride (SiN) and silicon carbon nitride (SiCN). The cap insulating layer 171 has a thickness of about 10 to 50 nm. These steps are performed in the same way as that of the normal semiconductor device with a copper (Cu) wiring layer.

Then, as shown in FIG. 3B, the first oxide semiconductor layer 230 serving as the channel of the first transistor 200 is formed over the cap insulating layer 171, for example, by sputtering. Suitable materials for the channel include an InGaZnO (IGZO) layer, an InZnO layer, a ZnO layer, a ZnAlO layer, a ZnCuO layer, a NiO layer, a SnO layer, a $SnO_2$ layer, a CuO layer, a $Cu_2O$ layer, a $Ta_2O_5$ layer, and a $TiO_2$ layer. The first oxide semiconductor layer 230 has a thickness of about 10 to 50 nm. Subsequently, the first hard mask 232 is formed over the first oxide semiconductor layer 230, for example, by a plasma CVD method. The first hard mask 232 is an insulating film made of silicon oxide ($SiO_2$), silicon oxycarbide (SiOC), carbon (C), or silicon nitride (SiN), or a combination thereof. The first hard mask 232 preferably has a thickness of about 30 to 200 nm.

Then, as shown in FIG. 3C, the first oxide semiconductor layer 230 and the first hard mask 232 are patterned using the normal photolithography and dry etching. Thus, the first oxide semiconductor layer 230 and the first hard mask 232 are formed into the element shape of the first transistor 200. That is, the first oxide semiconductor layer 230 serving as the channel for the first transistor 200 is shaped in the form of island (see FIG. 2). Then, as shown in FIG. 3D, a resist over the first hard mask 232 is removed. As a result, the cap insulating layer 171 and the first hard mask 232 are exposed over the surface, and further the sides of the island-shaped first oxide semiconductor layer 230 under the first hard mask 232 are also exposed.

Then, as shown in FIG. 3E, the insulating film (hereinafter referred to as the coated insulating film 240) serving as the sidewalls 240 is formed over the cap insulating layer 171 and the first hard mask 232, for example, by the CVD method. Suitable materials for the coated insulating film 240 (insulating film serving as the sidewall 240) include silicon oxide ($SiO_2$), and silicon nitride (SiN). The insulating film 240 has a thickness of about 10 to 200 nm. The coated insulating film 240 covers not only the surfaces of the cap insulating layer 171 and the first hard mask 232, but also the exposed sides of the first oxide semiconductor layer 230.

Then, as shown in FIG. 3F, the entire coated insulating film 240 is etched back. Thus, the sidewalls 240 are formed over the sides of the first oxide semiconductor layer 230 and the first hard mask 232. Each sidewall 240 covers the exposed side of the island-shaped first oxide semiconductor layer 230 to protect the side from influences of other films and processes. Taking into consideration the role of the sidewall 240, the sidewall 240 has only to cover at least the sidewall of the first oxide semiconductor layer 230 even when the sidewall 240 does not cover the side of the first hard mask 232. As shown in FIG. 3L, when the thickness of the part etched back is decreased for safety to form the sidewall 240 over the sides of the first oxide semiconductor layer 230 and the first hard mask 232, the coated insulating film 240 may remain slightly above the cap insulating layer 171 and the first hard mask 232.

Figure 3G:
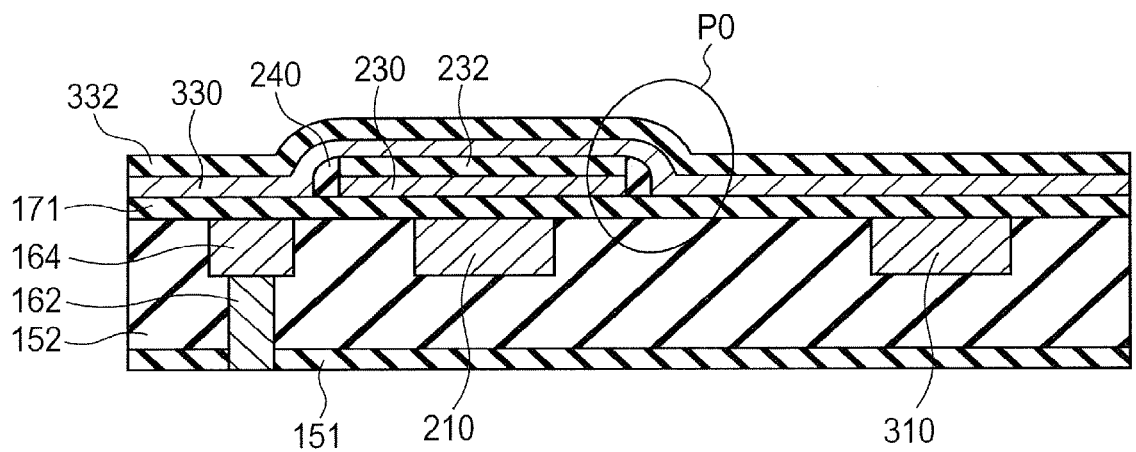
FIG. 3G is a cross-sectional view showing another step of the manufacturing method of the semiconductor device in the first embodiment.

Then, as shown in FIG. 3G, the second oxide semiconductor layer 330 serving as the channel of the second transistor 300 is formed over the cap insulating layer 171, the first hard mask 232, and the sidewalls 240, for example, by the sputtering. Suitable materials for the channel include an InGaZnO (IGZO) layer, an InZnO layer, a ZnO layer, a ZnAlO layer, a ZnCuO layer, a NiO layer, a SnO layer, a $SnO_2$ layer, a CuO layer, a $Cu_2O$ layer, a $Ta_2O_5$ layer, and a $TiO_2$ layer. The second oxide semiconductor layer 330 has a thickness of about 10 to 50 nm. Subsequently, the second hard mask 332 is formed over the second oxide semiconductor layer 330, for example, by the plasma CVD method. The second hard mask 332 is an insulating film made of silicon oxide ($SiO_2$), silicon oxycarbide (SiOC), carbon (C), or silicon nitride (SiN), or a combination thereof. The second hard mask 332 has a thickness of about 30 to 200 nm.

Figure 3H:
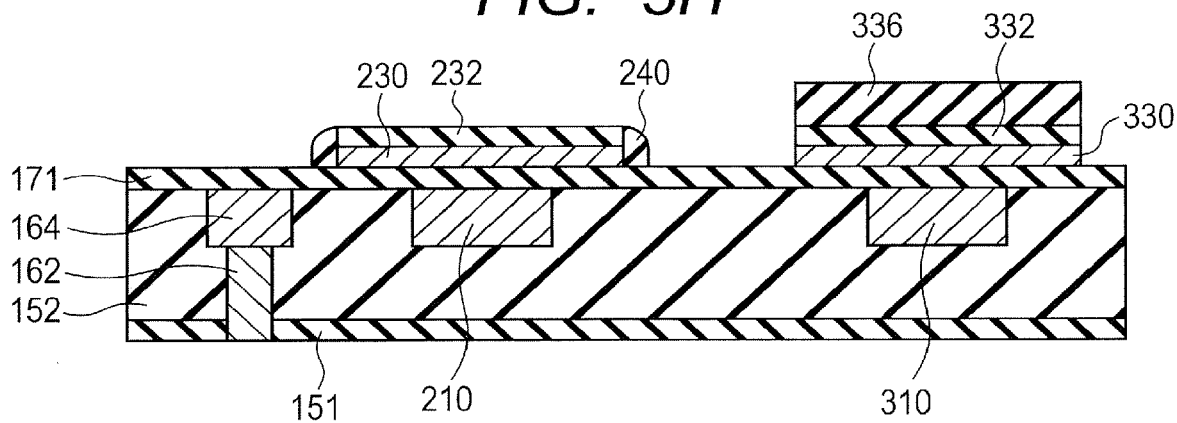
FIG. 3H is a cross-sectional view showing another step of the manufacturing method of the semiconductor device in the first embodiment.
Figure 3I:
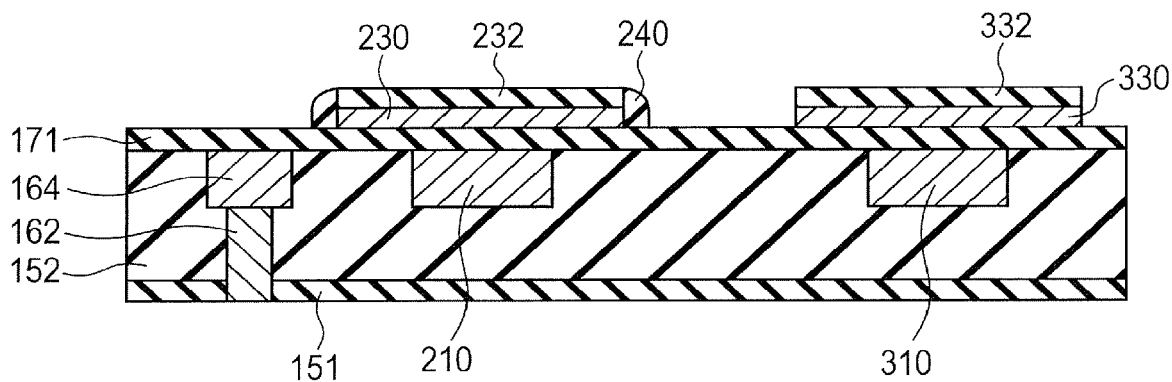
FIG. 3I is a cross-sectional view showing another step of the manufacturing method of the semiconductor device in the first embodiment.

Then, as shown in FIG. 3H, the second oxide semiconductor layer 330 and the second hard mask 332 are patterned using the normal photolithography and dry etching. The second oxide semiconductor layer 330 and the second hard mask 332 are formed in the shape corresponding to the element shape of the second transistor 300. That is, the second oxide semiconductor layer 330 serving as a channel for the second transistor 300 is shaped in the form of island (see FIG. 2). Then, as shown in FIG. 3I, a resist over the second hard mask 332 is removed. The first transistor 200 including the first hard mask 232, the first oxide semiconductor layer 230, and the sidewalls 240, and the second transistor 300 including the second hard mask 332 and the second oxide semiconductor layer 330 are formed over the cap insulating layer 171.

Figure 3J:
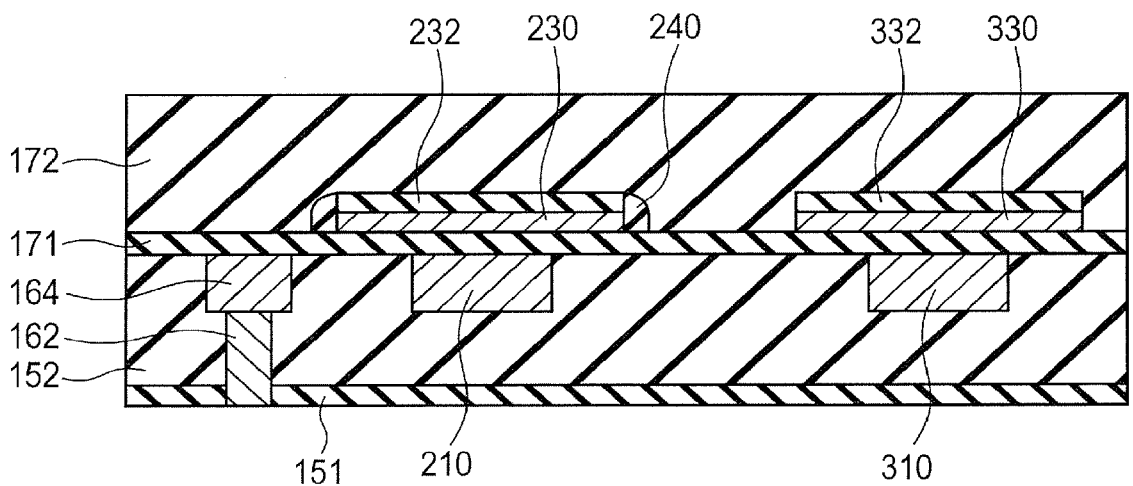
FIG. 3J is a cross-sectional view showing another step of the a manufacturing method of the semiconductor device in the first embodiment.
Figure 3K:
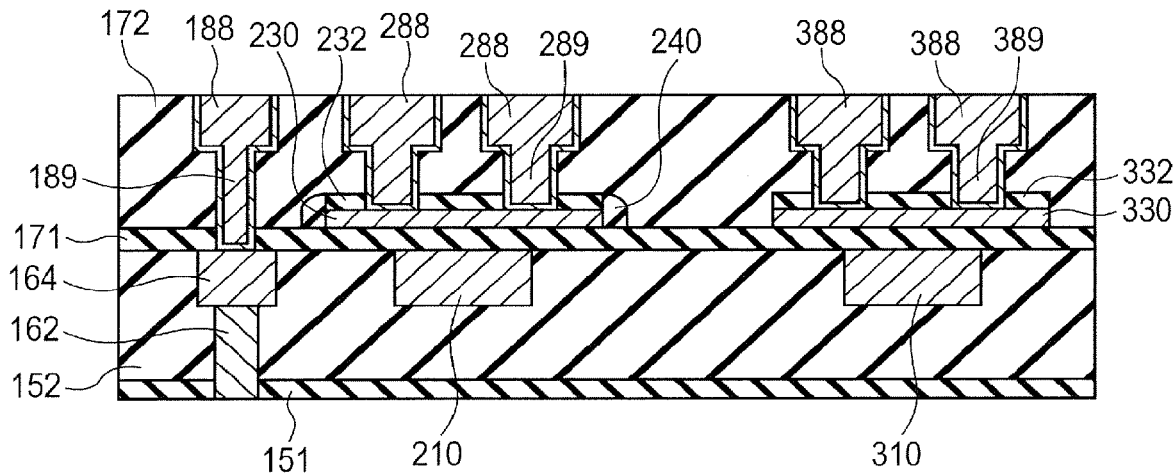
FIG. 3K is a cross-sectional view showing another step of the manufacturing method of the semiconductor device in the first embodiment.
Figure 3L:
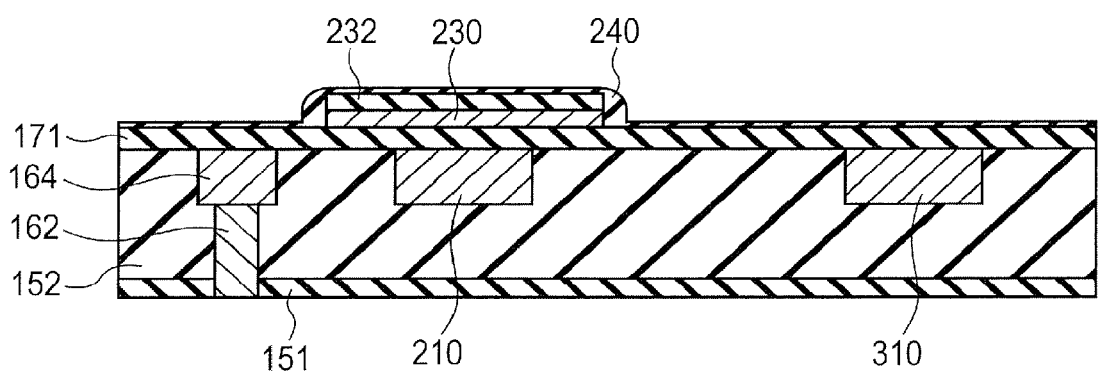
FIG. 3L is a cross-sectional view showing another step of the manufacturing method of the semiconductor device in the first embodiment.

Then, as shown in FIG. 3J, the second interlayer insulating layer 172 is formed to cover the cap insulating layer 171, the first hard mask 232, the sidewalls 240, and the second hard mask 332. The second interlayer insulating layer 172 is a low-dielectric insulating layer made of silicon oxide ($SiO_2$) or material having a dielectric constant lower than that of silicon oxide. The second interlayer insulating layer 172 can be a carbon-containing film, such as a SiOC(H) film or a SiLK (registered trademark). Substantially, as shown in FIG. 3K, the via 189, the contacts (source/drain electrode) 289 and 389, and the second wirings 188, 288, and 388 are embedded in the second interlayer insulating layer 172 by the single damascene method or dual damascene method. Thus, the second wiring layer 170 is formed. Suitable materials for the via 189, the contacts 289 and 389, and the second wirings 188, 288, and 388 include copper (Cu) using a titanium (Ti)/titanium nitride (TiN) or Ta/TaN as a barrier film. Although not shown in the figure, the second interlayer insulating layer 172 may use a pad electrode comprised of TiN/Al/TiN/Ti which is formed over the second interlayer insulating layer 172 embedded in the formed via.

In the above steps, the semiconductor device 100 according to this embodiment is manufactured.

Figure 3M:
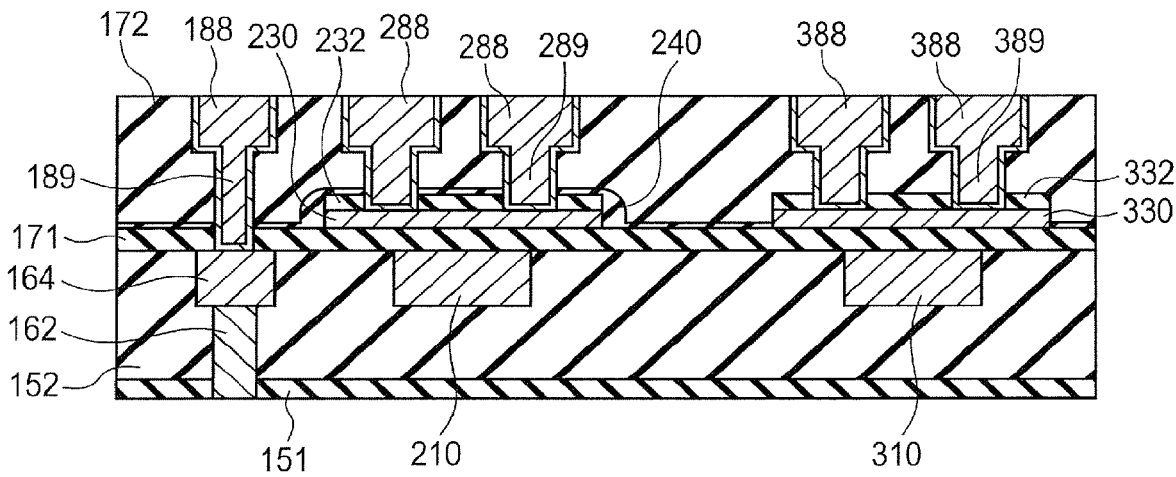
FIG. 3M is a cross-sectional view showing another step of the manufacturing method of the semiconductor device in the first embodiment.

As shown in FIG. 3L instead of FIG. 3F, when the coated insulating film 240 slightly remains over the cap insulating layer 171 and the first hard mask 232 upon forming the sidewalls 240 on the sides of the first oxide semiconductor layer 230 and the first hard mask 232, the semiconductor device 100 finally takes the structure shown in FIG. 3M and not in FIG. 3K.

In the steps shown in FIGS. 3E and 3F of the manufacturing method of the semiconductor device in this embodiment, the sidewalls 240 are formed over the sides of the first oxide semiconductor layer 230 and the first hard mask 232. However, another manufacturing method of a semiconductor device without forming the sidewalls 240 can also be proposed. For example, the following method can be used.

Figure 4A:
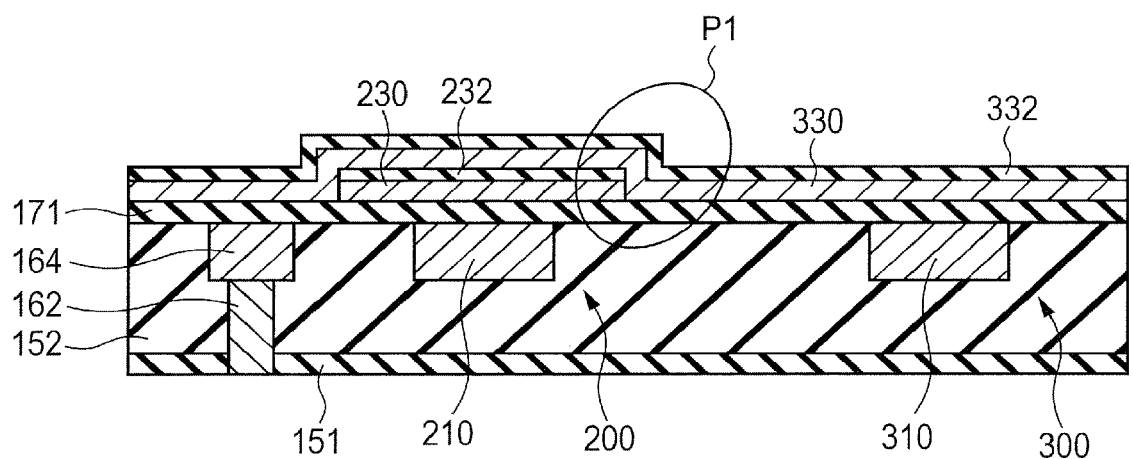
FIG. 4A is a cross-sectional view showing a step of a manufacturing method of a semiconductor device without forming sidewalls.
Figure 4B:
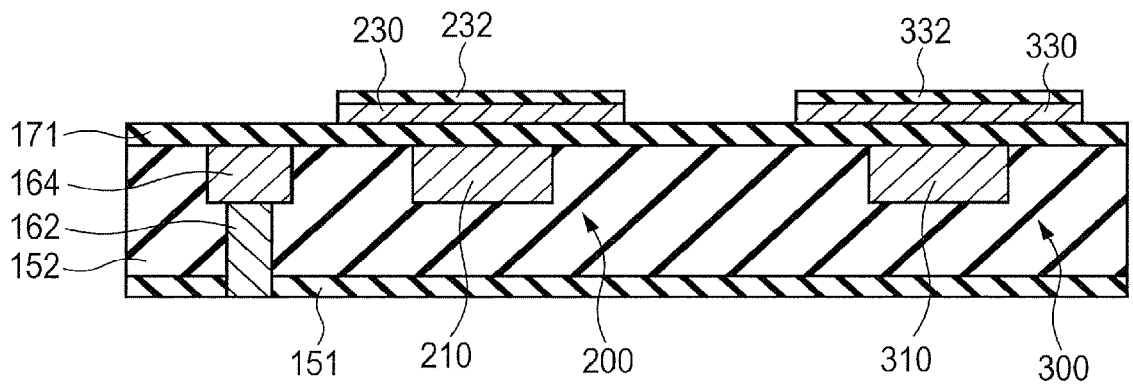
FIG. 4B is a cross-sectional view showing another step of the manufacturing method of a semiconductor device without forming sidewalls.

FIGS. 4A and 4B show cross-sectional views of (a part of) the manufacturing method of the semiconductor device without forming the sidewalls 240. As shown in FIG. 4A, directly after the step shown in FIG. 3D, the second oxide semiconductor layer 330 and the second hard mask 332 are deposited over the cap insulating layer 171, the first oxide semiconductor layer 230, and the first hard mask 232 in that order. Then, as shown in FIG. 4B, the second oxide semiconductor layer 330 and the second hard mask 332 are patterned using normal photolithography and dry etching. Thereafter, the same steps as those shown in FIGS. 3J and 3K are performed.

The above manufacturing method using the steps of FIGS. 4A and 4B are simplified by omitting the steps shown in FIGS. 3E and 3F. However, upon depositing the second oxide semiconductor layer 330, parts of the sides of the first oxide semiconductor layer 230 under the first hard mask 232 are exposed (see P1 of FIG. 4A). Thus, the second oxide semiconductor layer 330 is in contact with the sides of the first oxide semiconductor layer 230. As a result, the material of the second oxide semiconductor layer 330 might be diffused into the first oxide semiconductor layer 230. Alternatively, the material of the first oxide semiconductor layer 230 might be diffused into the second oxide semiconductor layer 330. Otherwise, etching residues might generate a region where the N-type and P-type semiconductor areas are in contact with each other, which possibly modifies and degrades the properties of the first oxide semiconductor layer 230.

In this embodiment, in the steps shown in FIGS. 3E and 3F, the sidewalls 240 are formed over the sides of the cap insulating layer 171 and the first hard mask 232. Each sidewall 240 covers the exposed side of the first oxide semiconductor layer 230 to separate the first oxide semiconductor layer 230 from other films (for example, second oxide semiconductor layer 330) physically, chemically, and electrically. Thus, the function of the sidewall 240 as the element isolation film can prevent the modification and degradation of the properties of the first oxide semiconductor layer 230.

In the steps shown in FIGS. 3E and 3F of the manufacturing method of the semiconductor device in this embodiment, the coated insulating film 240 is formed over the cap insulating layer 171 and the first hard mask 232, and etched back to thereby form the sidewalls 240. However, another manufacturing method of a semiconductor device can also be proposed which involves maintaining the coated insulating film 240 as it is without etching back. For example, the following method can be used.

Figure 5A:
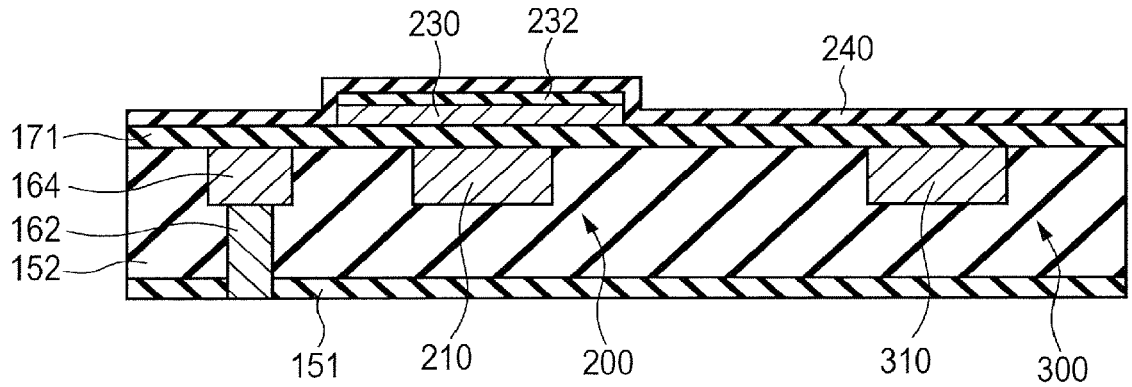
FIG. 5A is a cross-sectional view showing a step of a manufacturing method of a semiconductor device with a coated insulating film for a sidewall remaining.
Figure 5B:
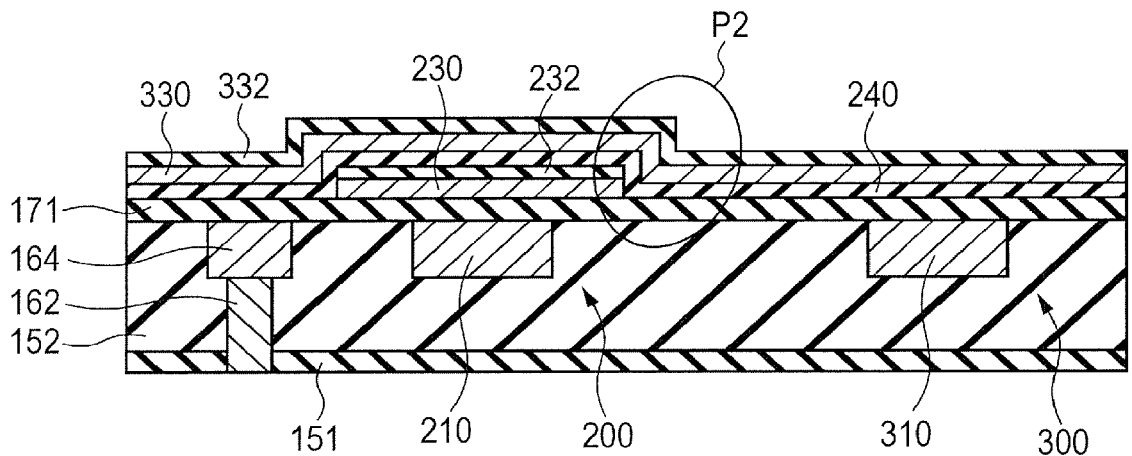
FIG. 5B is a cross-sectional view showing another step of the manufacturing method of a semiconductor device with the coated insulating film for a sidewall remaining.
Figure 5C:
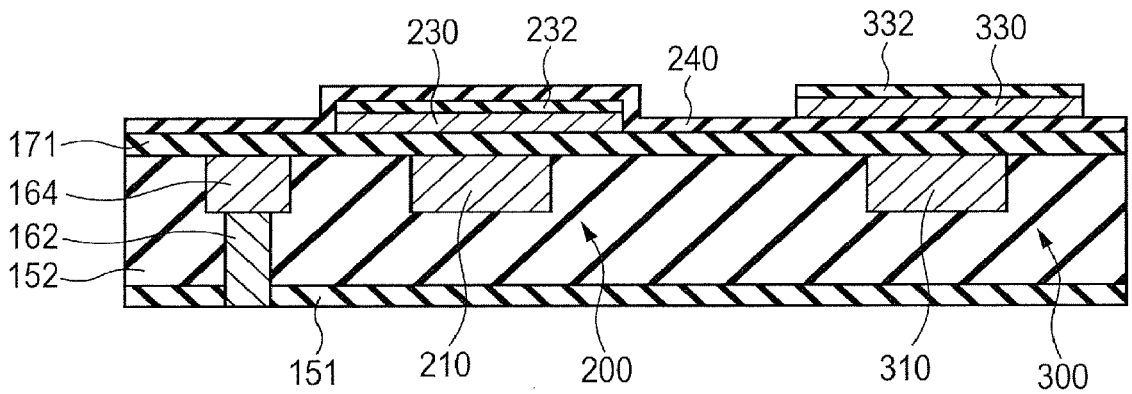
FIG. 5C is a cross-sectional view showing another step of the manufacturing method of a semiconductor device with the coated insulating film for a sidewall remaining.
Figure 5D:
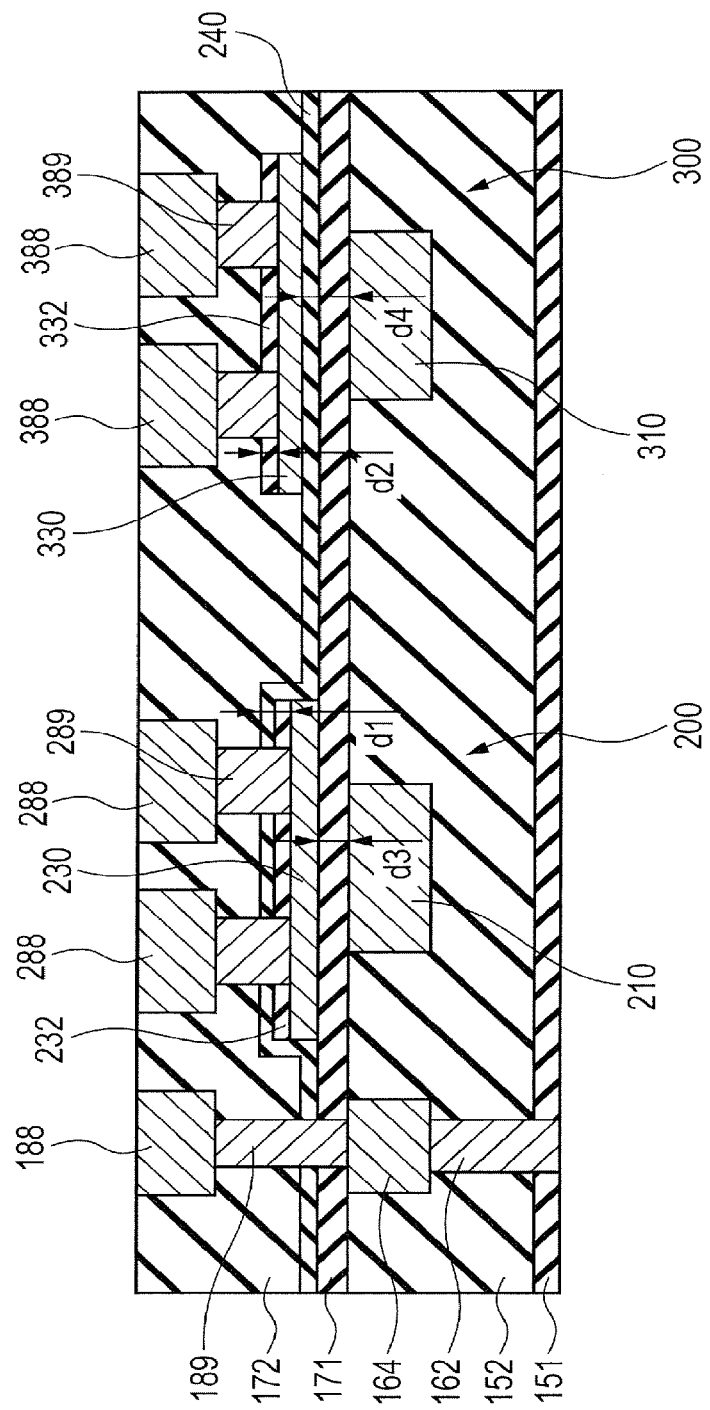
FIG. 5D is a cross-sectional view showing another step of the manufacturing method of a semiconductor device with the coated insulating film for a sidewall remaining.

FIGS. 5A to 5D show cross-sectional views of (a part of) the manufacturing method of the semiconductor device with the coated insulating film for the sidewall remaining. Directly after the step shown in FIG. 5A (which is the same as that of FIG. 3E), as shown in FIG. 5B, the second oxide semiconductor layer 330 and the second hard mask 332 are deposited over the coated insulating film 240 in that order without performing the etching back. Then, as shown in FIG. 5C, the second oxide semiconductor layer 330 and the second hard mask 332 are patterned using the normal photolithography and dry etching. Then, as shown in FIG. 5D, the second interlayer insulating layer 172 is formed to cover the coated insulating film 240 and the second hard mask 332, so that the via 189, the contacts 289 and 389, and the second wirings 188, 288, and 388 are embedded in the second interlayer insulating layer 172 by the single damascene method or dual damascene method.

The above manufacturing method using the steps of FIGS. 5A to 5D are simplified by omitting the step shown in FIG. 3F. Additionally, upon depositing the second oxide semiconductor layer 330, the sides of the first oxide semiconductor layer 230 under the first hard mask 232 are covered with the coated insulating film 240, which can prevent the modification and degradation of the properties of the first oxide semiconductor layer 230 which might be caused in the steps of FIGS. 4A and 4B in the related art (see P2 of FIG. 5B). That is, the coated insulating film 240 plays the role of the element isolation film. The manufacturing method, however, has the following problems.

Then, as shown in FIG. 5D, a laminated structure (having a thickness d1) of the first hard mask 232 and the coated insulating film 240 is formed over the first oxide semiconductor layer 230. In contrast, only the second hard mask 332 (having a thickness d2) is formed over the second oxide semiconductor layer 330. This causes a difference in thickness of the insulating film over the oxide semiconductor layer between the first transistor 200 and the second transistor 300 ($\Delta d1 = d1 - d2$). When forming the contact holes, including the contacts 289 and 389, by etching, such a difference in thickness $\Delta d1$ might make it impossible to perform the appropriate etching. For example, when etching is intended to be performed to match the depth of the contact hole for the contact 289, an etched part might penetrate the second oxide semiconductor layer 330 through the contact hole of the contact 389. Further, when etching is intended to be performed to match the depth of the contact hole for the contact 389, the contact hole including the contact 289 cannot be dug sufficiently, and an etched part might not reach the first oxide semiconductor layer 230.

At the same time, as shown in FIG. 5D, the gate insulating film of the first transistor 200 is only the cap insulating film 171 (having a thickness d3). In contrast, the gate insulating film of the second transistor 300 includes a laminated structure (having a thickness d4) of the cap insulating layer 171 and the coated insulating film 240. This causes a difference in thickness of the gate insulating film between the first transistor 200 and the second transistor 300 ($\Delta d2 = d4 - d3$). In use of the first transistor 200 and the second transistor 300 as the CMOS inverter, such a difference in thickness $\Delta d2$ might make it almost impossible to appropriately perform on-off operations.

The differences in film thickness $\Delta d1$ and $\Delta d2$ are caused depending on whether the coated insulating film 240 exists above the oxide semiconductor layer (channel) or under the layer as shown in FIG. 5D. The difference in thickness $\Delta d2$ between the gate insulating films can be extinguished by another manufacturing method of a modified example of this embodiment to be described later and the like. This method enables selection of the gate insulating film optimized for the conductive types of the respective oxide semiconductors. In contrast, the difference in thickness $\Delta d1$ between the insulating films over the oxide semiconductor layer is difficult to extinguish.

However, the manufacturing method of the semiconductor device according to this embodiment can solve the problems.

FIG. 6 is a table showing the difference between the structure shown in FIG. 5D and the structure of this embodiment. The column "B" indicates the structure shown in FIG. 5D, and the column "A" indicates the structure of this embodiment. The column "NMOS" indicates the thickness of the insulating layer over the first oxide semiconductor layer 230. The column "PMOS" indicates the thickness of the insulating layer over the second oxide semiconductor layer 330. The row "NMOS-HM" indicates the time of formation of the first hard mask 232. The row "NMOS PROCESS" indicates the time of processing the first hard mask 232 into the shape of a channel. The row "ELEMENT ISOLATION" indicates the time of formation of the coating insulating film 240, or formation of the sidewalls 240 by etching back in the following step. The row "PMOS-HM" indicates the time of formation of the second hard mask 332. The row "PMOS PROCESS" indicates the time of processing the second hard mask 332 into the shape of a channel. The row "ILD DEPOSITION" indicates the time of formation of an interlayer insulating layer 1720.

In the structure ("B") shown in FIG. 5D, a laminated structure of a remaining film (of 60 nm in thickness) of the hard mask (HM) obtained after the process, and the coated insulating film 240 (of 50 nm in thickness) for element isolation remains in the first transistor 200 ("NMOS") previously formed. As a result, the thickness of the film over the first oxide semiconductor 230 becomes 110 nm ("ELEMENT ISOLATION"). Thereafter, the remaining film (of 60 nm in thickness) of the hard mask (HM) obtained after the process remains at the formed second transistor 300 ("PMOS"). As a result, the thickness of the film over the second oxide semiconductor 330 becomes 60 nm ("PMOS PROCESS"). This results in a difference in thickness $\Delta d$ (in the example of this Table, 50 nm) between the part located over the first oxide semiconductor layer 230 and the part located over the second oxide semiconductor layer 330. This might lead to the excessive etching of the upper part of the second oxide semiconductor layer 330 (over the PMOS) when the dry etching time for formation of the contact hole is set to the time required to etch the part over the first oxide semiconductor layer 230 (over the NMOS).

In the structure ("A") of this embodiment, the element isolation is achieved not by the coated insulating film 240 itself, but by the sidewalls 240 formed by etching back the coated insulating film 240. Also, after the "element isolation", there is no difference between the part over the first oxide semiconductor layer 230 and the part over the second oxide semiconductor layer 330. As a result, the dry etching time for formation of the contact hole can be set to the same value between the etching of the part located over the first oxide semiconductor layer 230 and the etching of the part located over the second oxide semiconductor layer 330. Thus, there is no case where one oxide semiconductor layer (on the PMOS side in the example of the table) is entirely extinguished (that is, where the contact hole completely penetrates the oxide semiconductor layer). As a result, this embodiment can prevent the decrease in yield of the semiconductor device due to contact defects in the formation of the CMOS including the active elements in the wiring layer.

First Modified Example

Figure 7:
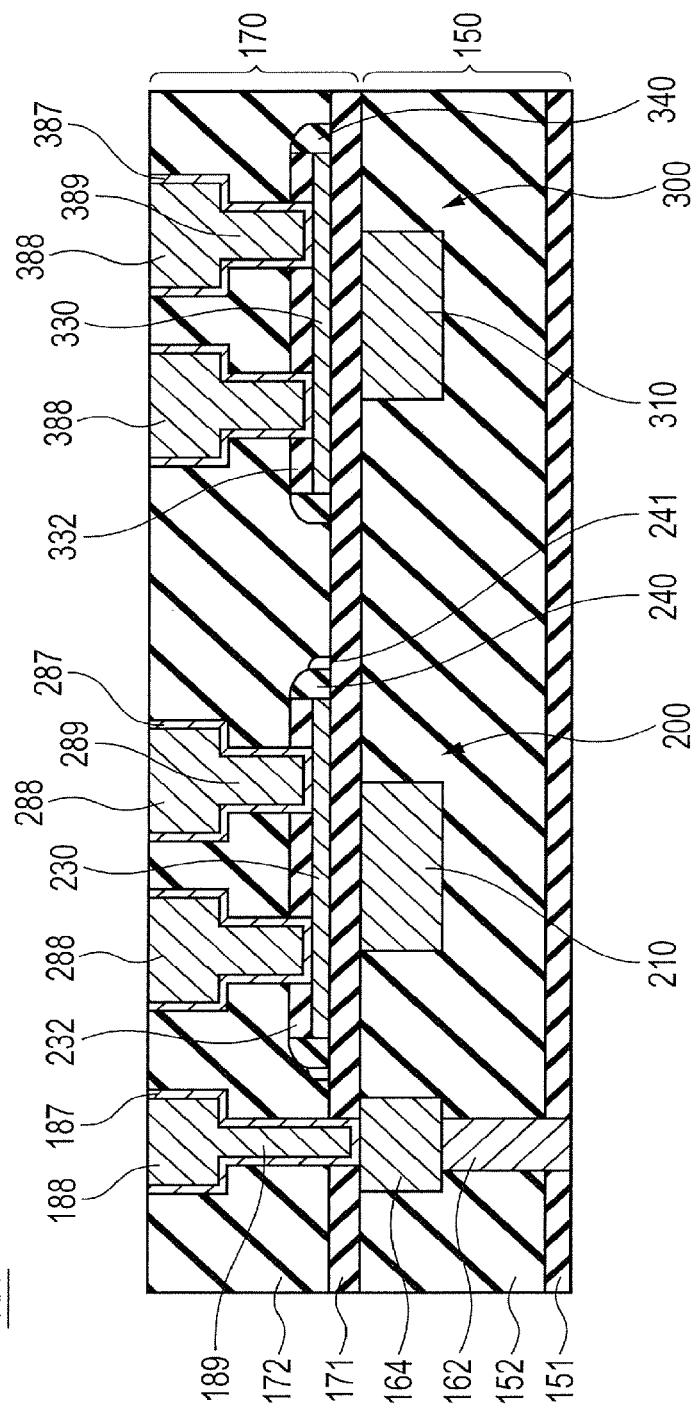
FIG. 7 is a cross-sectional view showing a first modified example of the structure of the semiconductor device according to the first embodiment.

FIG. 7 shows a cross-sectional view of a first modified example of the structure of the semiconductor device in this embodiment. The case shown in FIG. 7 differs from the case shown in FIG. 1A in not only that the sidewalls 240 are formed over the sides of the first hard mask 232 and the first oxide layer 230, but also that sidewalls 340 are formed over the sides of the second hard mask 332 and the second oxide semiconductor layer 330. The differences will be mainly described below.

In order to obtain such a structure, in the manufacturing method of the semiconductor device shown in FIGS. 3A to 3K, the following steps may be inserted into between the steps shown in FIGS. 3I and 3J. First, in the same way as the step shown in FIG. 3E, the insulating film serving as the sidewall 340 is formed over the cap insulating layer 171, the first hard mask 232, the sidewalls 240, and the second hard mask 332, for example, by the CVD method. Then, in the same way as the step shown in FIG. 3F, the entire insulating film serving as the sidewall 340 is etched back. Thus, the sidewalls 340 are formed over the sides of the second oxide semiconductor layer 330 and the second hard mask 332. In this case, a sidewall 241 sometimes remains over the side of the sidewall 240.

The modified example can also provide the same effects as those exhibited in the cases shown in FIGS. 1A, 1B, and 2. Further, each sidewall 340 covers the exposed side of the second oxide semiconductor layer 330. Thus, the sidewalls 340 can protect the second oxide semiconductor layer 330 against influences from other films or processes.

Second Modified Example

Figure 8:
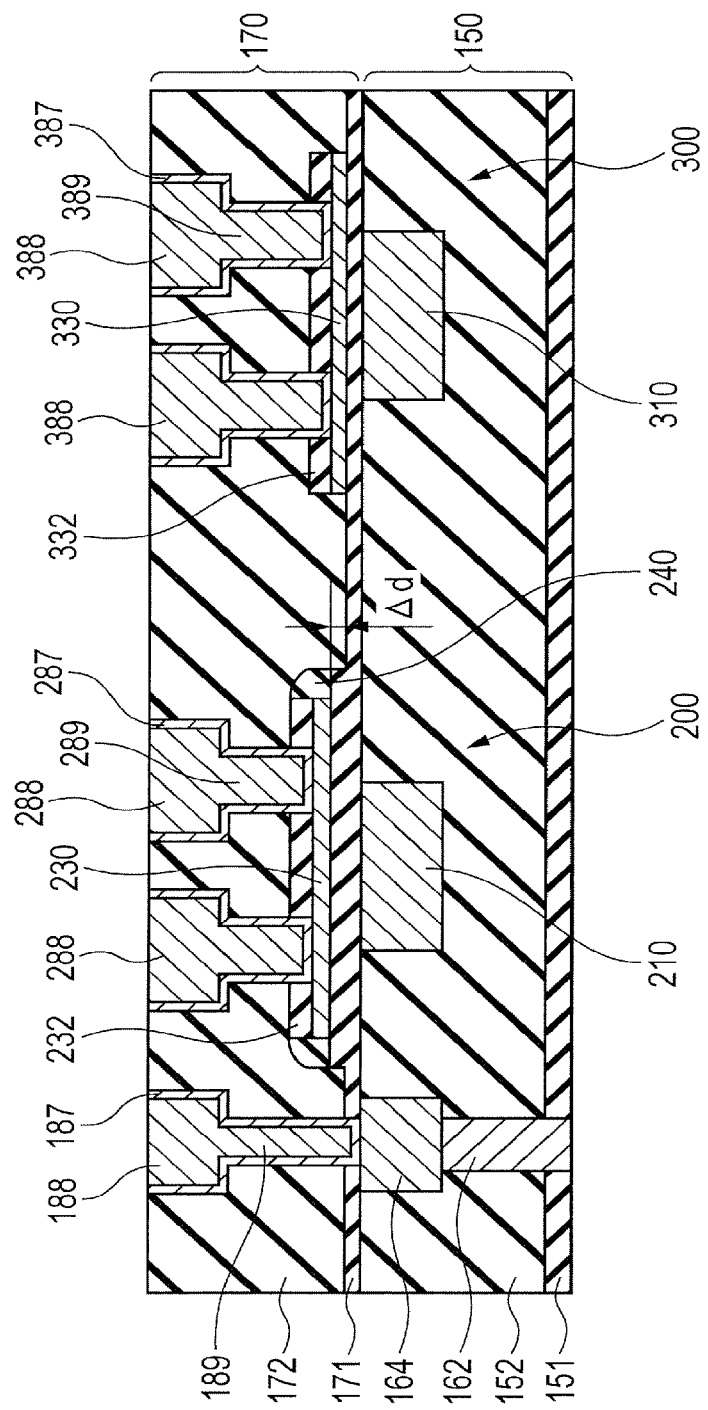
FIG. 8 is a cross-sectional view showing a second modified example of the structure of the semiconductor device in the first embodiment.

FIG. 8 shows a cross-sectional view of a second modified example of the structure of the semiconductor device in this embodiment. The case shown in FIG. 8 differs from the case shown in FIG. 1 in that the thickness of the cap insulating layer 171 differs between in the position of the first transistor 200 and in the position of the second transistor 300. Now, the differences will be mainly described.

The cap insulating layer 171 for preventing diffusion of Cu is thinner in a region without the first oxide semiconductor layer 230 than that in another region with the first oxide semiconductor layer 230 by a difference in thickness Δd. Such a structure is very useful when a difference in thickness of the gate insulating film between the first transistor 200 and the second transistor 300 is required due to the difference in material properties between the first oxide semiconductor layer 230 and the second oxide semiconductor layer 330.

Figure 9A:
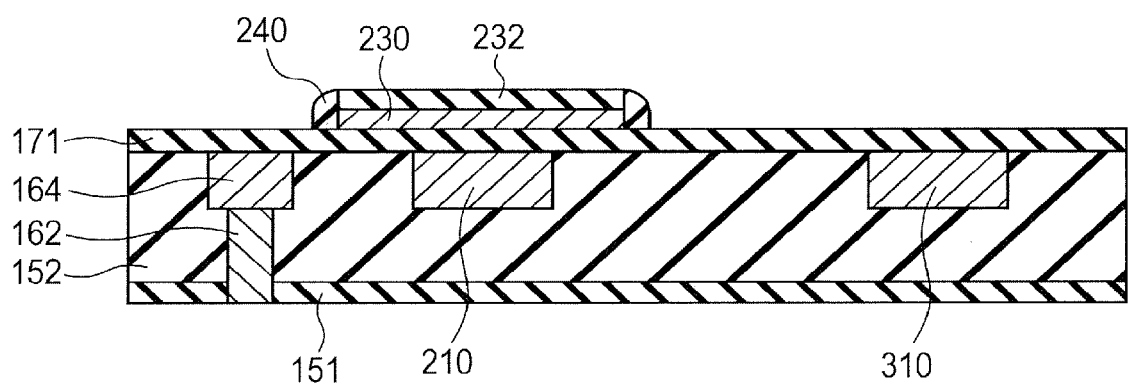
FIG. 9A is a cross-sectional view showing a step of a manufacturing method of the semiconductor device in the second modified example of the first embodiment.
Figure 9B:
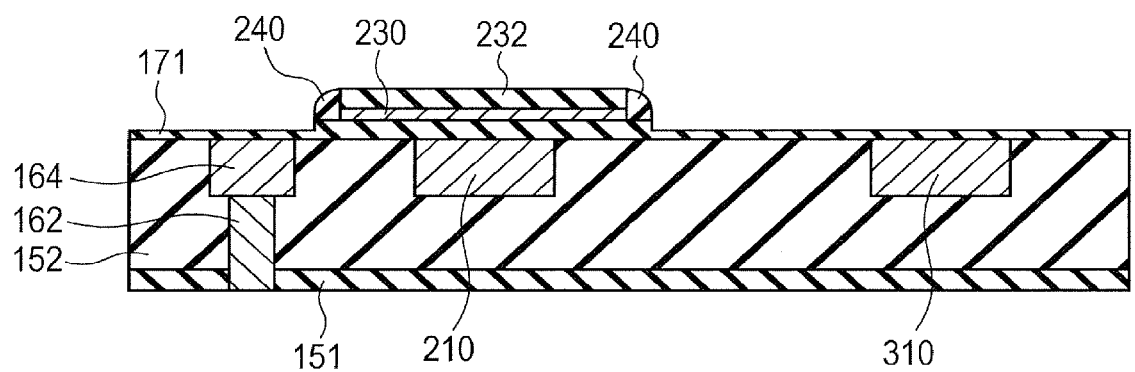
FIG. 9B is a cross-sectional view showing another step of the manufacturing method of the semiconductor device in the second modified example of the first embodiment.

FIGS. 9A and 9B show cross-sectional views of a manufacturing method (a part thereof) of the second modified example of the semiconductor device in the first embodiment. After the step shown in FIG. 3E, as shown in FIG. 9A (which is the same as the step shown in FIG. 3F), the sidewalls 240 are formed over the sides of the first oxide semiconductor layer 230 and the first hard mask 232, and then as shown in FIG. 9B, over-etching is performed for an adequate over etching time. Thus, the cap insulating film 171 can be selectively thinned in the region without the first oxide semiconductor layer 230. The following steps are the same as those after the step shown in FIG. 3G. The over-etching at this time can adjust the thickness of the first hard mask 23 by etching back the entire surface.

The modified example can also provide the same effects as those exhibited in the cases shown in FIGS. 1A, 1B, and 2.

This can cause a difference in thickness of the gate insulating film between the first transistor 200 and the second transistor 300.

Second Embodiment

Figure 10:
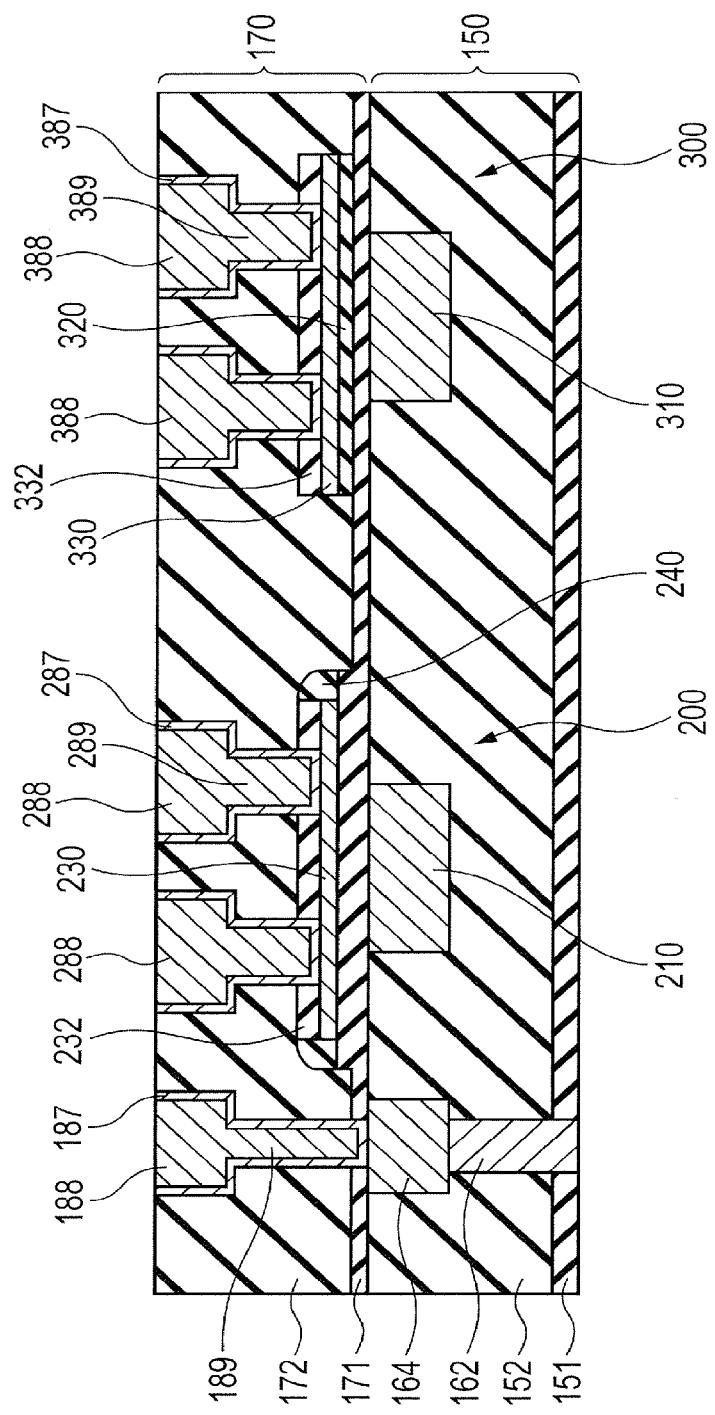
FIG. 10 is a cross-sectional view showing the structure of a semiconductor device according to a second embodiment of the invention.

The structure of a semiconductor device according to a second embodiment of the invention will be described below. FIG. 10 shows a cross-sectional view of the semiconductor device structure in this embodiment. The semiconductor device of this embodiment differs from the semiconductor device of the first embodiment, especially the second modified example of the first embodiment (see FIGS. 8, 9A and 9B) in that a gate insulating film of the second transistor 300 has a double-layered structure. The differences will be mainly described below.

The cap insulating layer 171 for preventing the diffusion of Cu is thinned in a region without the first oxide semiconductor layer 230 by a difference Δd in thickness of the layer as compared to in a region with the first oxide semiconductor layer 230 like the second modified example of the first embodiment. In this embodiment, however, a second upper gate insulating film 320 is formed between the thinned cap insulating layer 171 and the second oxide semiconductor layer 330. Thus, for example, even in the over-etching of the gate insulating film (171) of the first transistor 200 as shown in FIG. 9B, the gate insulating film of the first transistor 200 can have substantially the same thickness as that of the gate insulating film of the second transistor 300. For example, the gate insulating film of the second transistor 300 can be formed of the desired material (for example, high-k film) in the desired thickness.

Such a structure can be achieved by the following steps. First, after the step shown in FIG. 9B of the second modified example of the first embodiment, and before the step shown in FIG. 3G (formation of the second oxide semiconductor layer 330), the second upper gate insulating film 320 is formed. Suitable materials for the second upper gate insulating film 320 include, for example, silicon oxide ($SiO_2$), silicon nitride (SiN), and aluminum oxide (AlOx). Subsequently, in the step shown in FIG. 3G, the second oxide semiconductor layer 330 and the second hard mask 332 are formed above the second upper gate insulating film 320 in that order. In the steps shown in FIGS. 3H and 3I, the second transistor 300 is patterned in the form of a channel with respect to the second upper gate insulating film 320, the second oxide semiconductor layer 330, and the second hard mask 332. At that time, the second upper gate insulating film 320 is also processed in the same shape. Alternatively, the second upper gate insulating film 320 may not be patterned and may remain substantially on the front side. The following steps are the same as the steps shown in FIGS. 3J and 3K.

This embodiment can also provide the same effects as those exhibited in the first embodiment. By providing the second upper gate insulating film 320 under the second oxide semiconductor layer 330, each of the first oxide semiconductor layer 230 and the second oxide semiconductor layer 330 can have the corresponding optical (desired) gate insulating film. This can achieve the reduction in gate leakage, the control of a threshold of the transistor, and the improvement of reliability of the transistor. Especially, the second transistor 300 can have the optimized material and thickness.

Third Embodiment

Figure 11:
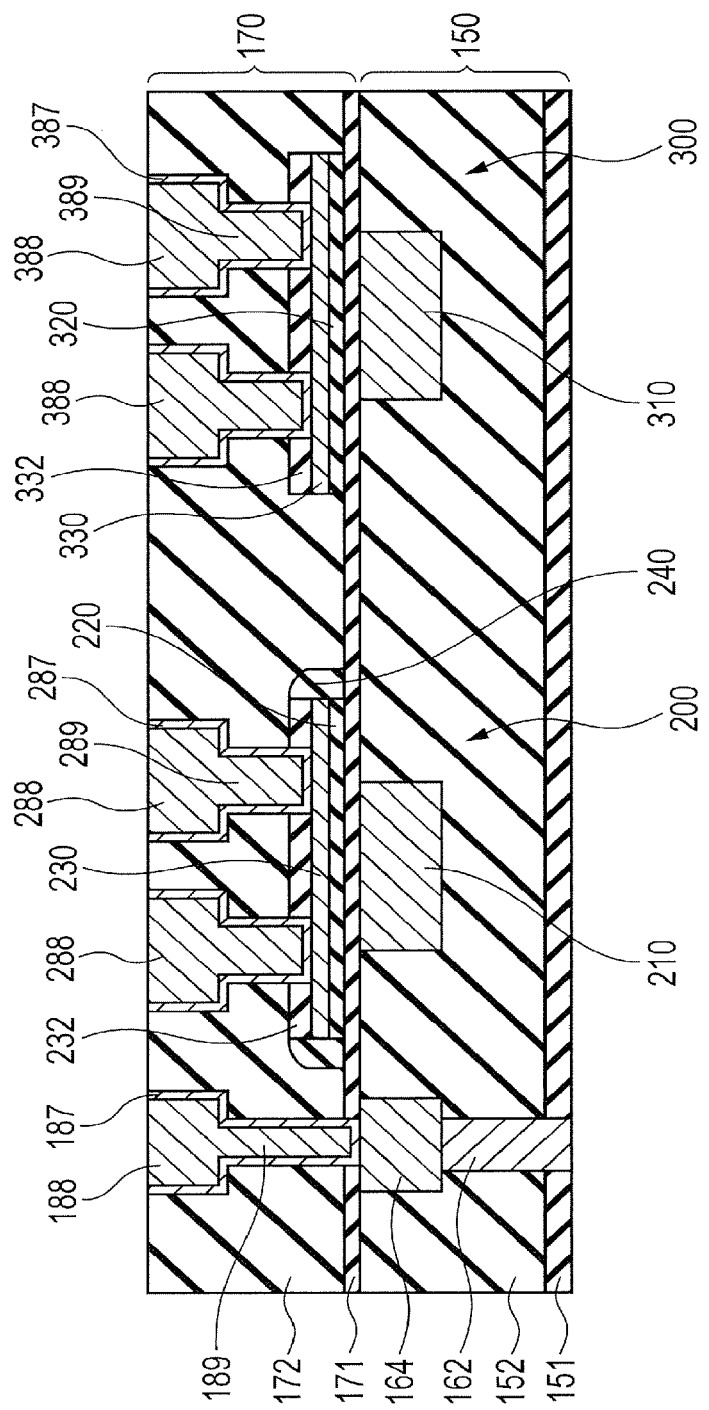
FIG. 11 is a cross-sectional view showing the structure of a semiconductor device according to a third embodiment of the invention.

The structure of a semiconductor device according to a third embodiment will be described below. FIG. 11 shows a cross-sectional view of the semiconductor device structure in this embodiment. The semiconductor device of this embodiment differs from the semiconductor device of the first embodiment in that both the gate insulating film of the first transistor 200 and the gate insulating film of the second transistor 300 have the double-layered structure. Now, the differences will be mainly described.

The cap insulating layer 171 for preventing the diffusion of Cu is formed over the first wiring layer 150 to have the uniform thickness. However, the second upper gate insulating film 220 is formed under the first oxide semiconductor layer 230, and the second upper gate insulating film 320 is formed under the second oxide semiconductor layer 330. Thus, for example, each of the gate insulating film of the first transistor 200 and the gate insulating film of the second transistor 300 can be formed of the desired material in the desired thickness. That is, the respective gate insulating films can be individually optimized.

Such a structure can be achieved by the following steps. First, after the step shown in FIG. 3A of the first embodiment, and before the step shown in FIG. 3B (formation of the first oxide semiconductor layer 230), the first upper gate insulating film 220 is formed. Subsequently, in the steps shown in FIGS. 3B to 3D, in patterning the first oxide semiconductor layer 230 and the first hard mask 232, the first upper gate insulating film 220 is processed into the same shape. Then, after the steps shown in FIGS. 3E and 3F, and before the step shown in FIG. 3G (formation of the second oxide semiconductor layer 330), the second upper gate insulating film 320 is formed. Then, in the steps shown in FIGS. 3G to 3I, in patterning the second oxide semiconductor layer 330 and the second hard mask 332, the second upper gate insulating film 320 is also processed into the same shape. The following steps are the same as the steps shown in FIGS. 3J and 3K.

This embodiment can also provide the same effects as those exhibited in the first embodiment.

The first upper gate insulating film 220 is disposed under the first oxide semiconductor layer 230, and the second upper gate insulating film 320 is disposed under the second oxide semiconductor layer 330, whereby each of the first oxide semiconductor layer 230 and the second oxide semiconductor layer 330 can have the optical (desired) gate insulating film. This can achieve the reduction in gate leakage, the control of a threshold of the transistor, and the improvement of reliability of the transistor. In particular, the materials and thicknesses of the first transistor 200 and the second transistor 300 can be respectively optimized.

Fourth Embodiment

Figure 12:
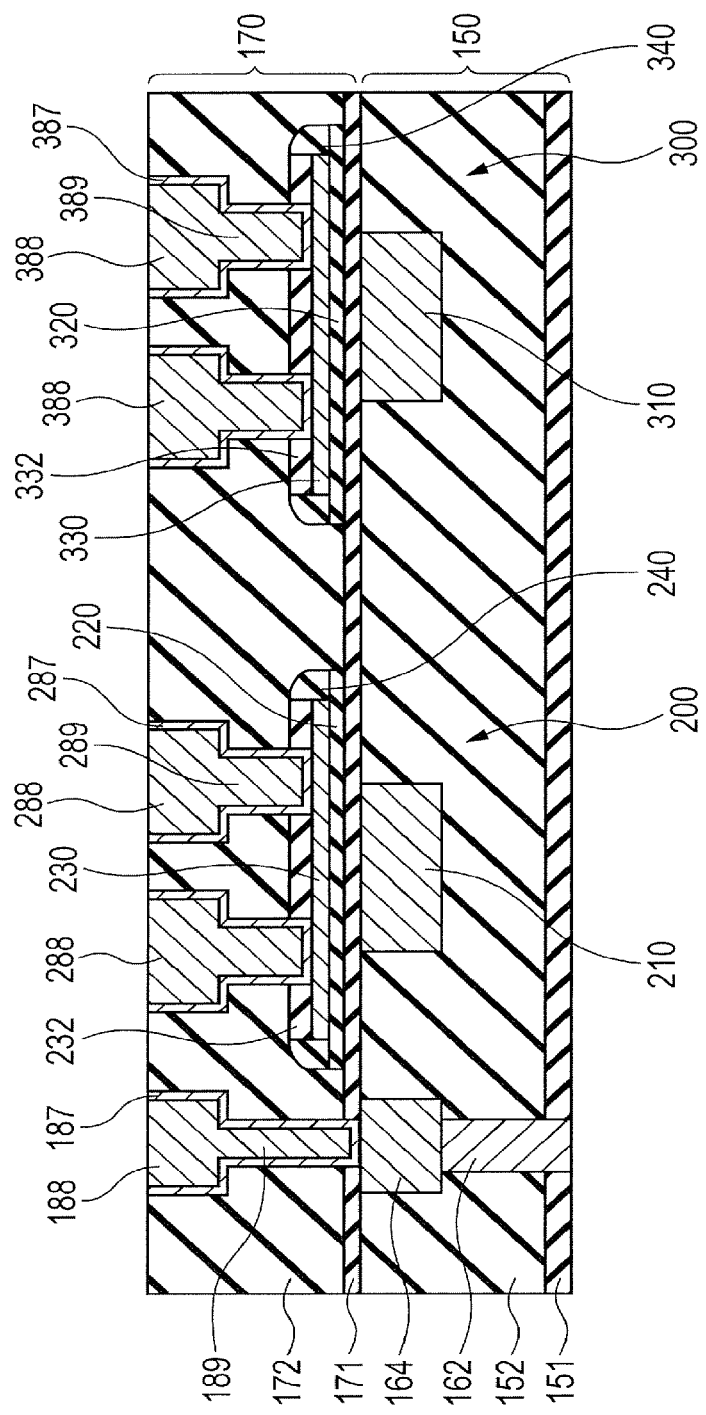
FIG. 12 is a cross-sectional view showing the structure of a semiconductor device according to a fourth embodiment of the invention.

The structure of a semiconductor device according to a fourth embodiment will be described below. FIG. 12 shows a cross-sectional view of the semiconductor device structure in this embodiment. The semiconductor device of this embodiment differs from the semiconductor device of the third embodiment in that the shape of the gate insulating film of each of the first transistor 200 and the second transistor 300 is larger than that of the oxide semiconductor layer in the planar view. Now, the differences will be mainly described.

The cap insulating layer 171 for preventing the diffusion of Cu is formed over the first wiring layer 150 to have the uniform thickness. In contrast, the sidewalls 240 are formed not only over the sides of the first oxide semiconductor layer 230 and the first hard mask 232, but also over the sides of the second oxide semiconductor layer 330 and the second hard mask 332. The first upper gate insulating film 220 is formed under the first oxide semiconductor layer 230 and the sidewalls 240 surrounding the semiconductor layer to have a shape that matches the shapes of the semiconductor layer 230 and the sidewalls 240. Likewise, the second upper gate insulating film 320 is formed under the second oxide semiconductor layer 330 and the sidewalls 340 surrounding the semiconductor layer to have a shape that matches the shapes of the semiconductor layer 330 and the sidewalls 340.

Figure 13A:
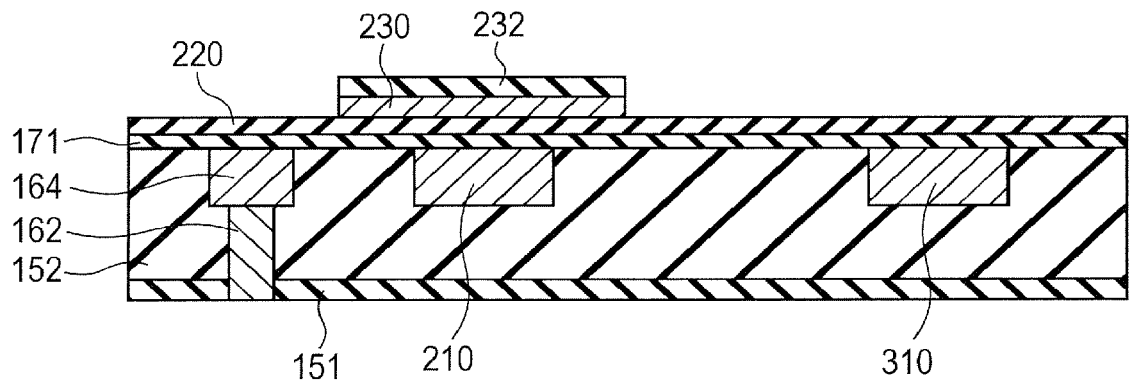
FIG. 13A is a cross-sectional view showing a step of a manufacturing method of a semiconductor device according to the third embodiment.
Figure 13B:
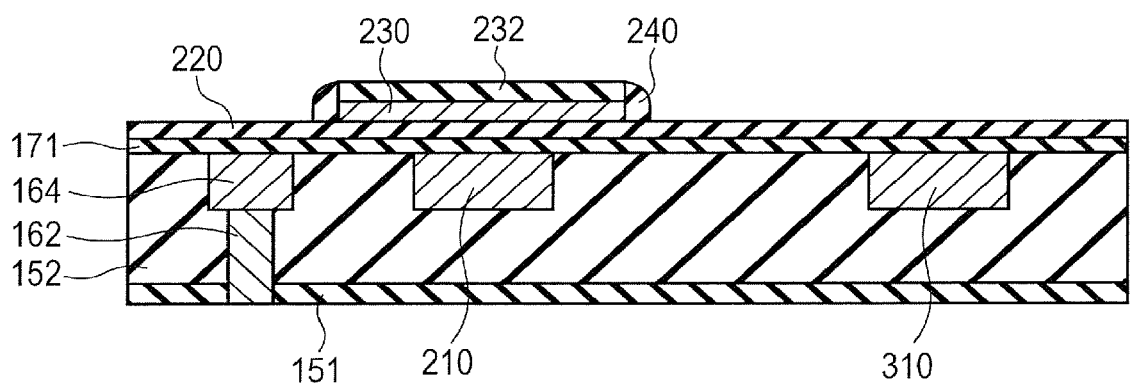
FIG. 13B is a cross-sectional view showing another step of the manufacturing method of a semiconductor device in the third embodiment.
Figure 13C:
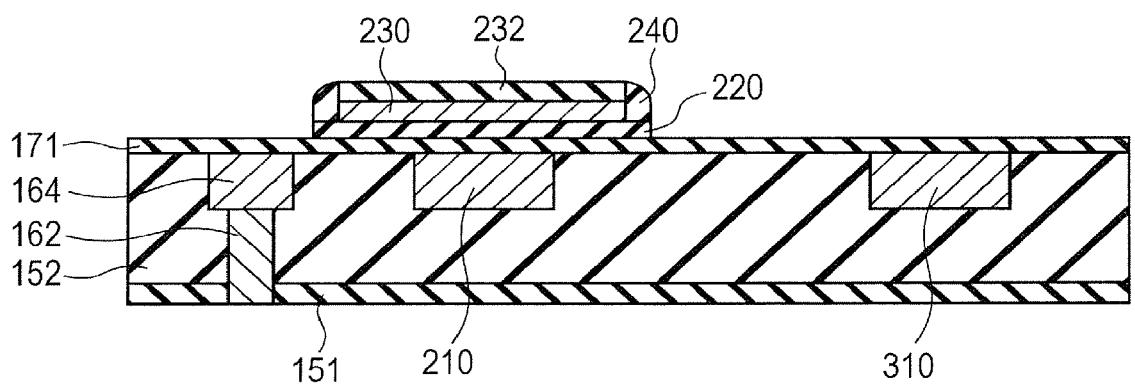
FIG. 13C is a cross-sectional view showing another step of the manufacturing method of a semiconductor device in the third embodiment.

Such a structure can be achieved by the following steps. FIGS. 13A to 13C show cross-sectional views of the manufacturing method (a part thereof) of the semiconductor device according to the third embodiment. First, after the step shown in FIG. 3A of the first embodiment, and before the step shown in FIG. 3B (formation of the second oxide semiconductor layer 230), the first upper gate insulating film 220 is formed. Subsequently, in the steps shown in FIGS. 3B to 3D, in patterning the first oxide semiconductor layer 230 and the first hard mask 232, the first upper gate insulating film 220 is not processed (see FIG. 13A). Then, after the steps shown in FIGS. 3E and 3F (FIG. 13B), and before the step shown in FIG. 3G (formation of the second oxide semiconductor layer 330), the first upper gate insulating film 220 is etched into the same shape as the first hard mask 232 and the sidewalls 240 (see FIG. 13C). Thus, an island-shaped laminated structure is formed on the first transistor 200 side. Then, the second upper gate insulating film 320 is formed to cover the laminated structure and the cap insulating layer 171. Subsequently, in the steps shown in FIGS. 3G to 3I, in patterning the second oxide semiconductor layer 330 and the second hard mask 332, the second upper gate insulating film 320 is not processed. After the step shown in FIG. 3I and before the step shown in FIG. 3J (formation of the second interlayer insulating layer 172), in the same way as the step shown in FIG. 3E, the insulating film serving as the sidewall 340 is formed over the second upper gate insulating film 320 and the second hard mask 332, for example, by the CVD method. Then, the entire insulating film serving as the sidewall 340 is etched back in the same way as the step shown in FIG. 3F. Thus, the sidewalls 340 are formed over the sides of the second oxide semiconductor layer 330 and the second hard mask 332 (in this case, the sidewalls 241 often remain over the sides of the sidewall 240). Thereafter, the second upper gate insulating film 320 is etched into the shape of the second hard mask 332 and the sidewall 340. Thus, an inland-shaped laminated structure is formed on the second transistor 300 side. The following steps are the same as the steps shown in FIGS. 3J and 3K.

This embodiment can also provide the same effects as those exhibited in the third embodiment.

Additionally, the gate insulating film (of two layers) can be set wider than the channel (oxide semiconductor layer). The use of the above structure can largely reduce the leakage at the end surface of the gate insulating film, which can manufacture the device with higher reliability.

When only one layer of the cap insulating layer 171 is sufficient to serve as the insulating film under the sidewalls 240 and 340, the hard masks 232 and 332, the oxide semiconductor layers 230 and 330, and the gate insulating films 220 and 320 may be totally etched at once, and thereafter the sidewalls 240 may be formed.

Fifth Embodiment

Figure 14:
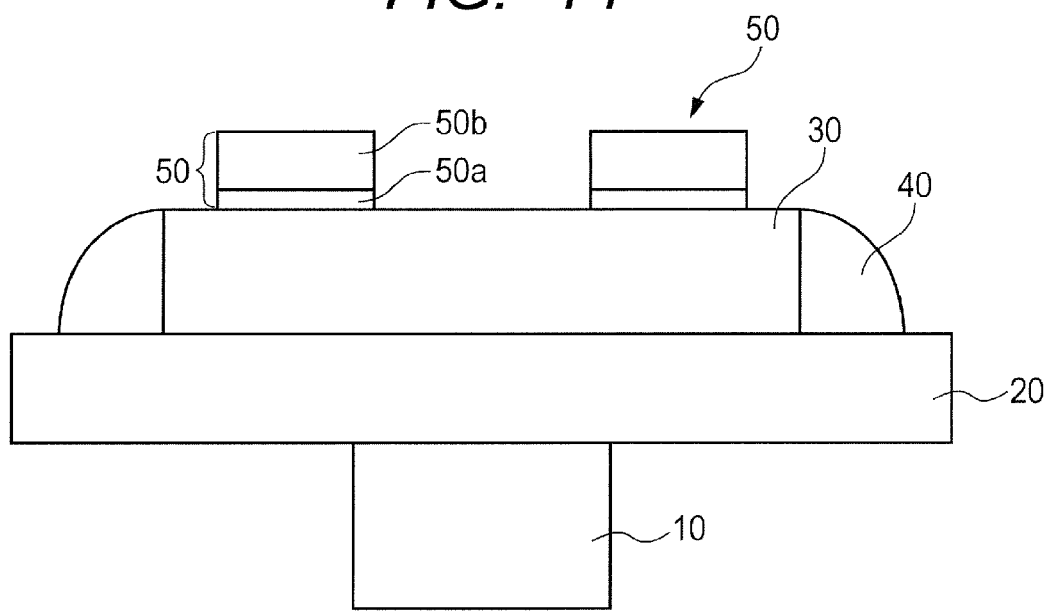
FIG. 14 is a cross-sectional view showing the structure of a semiconductor device according to the fourth embodiment.

The structure of a semiconductor device in a fifth embodiment of the invention will be described below. FIG. 14 shows a cross-sectional view of the semiconductor device structure in this embodiment. This embodiment relates to a P-type transistor using a P-type oxide semiconductor layer as a channel. Such a transistor can be used as the transistor of the semiconductor device in each of the first to fourth embodiments. Further, this embodiment can be applied not only to the transistor of the semiconductor device, but also widely to electric coupling between a P-type oxide semiconductor layer and metal and another electric coupling between a wide bandgap semiconductor and metal in the same way.

FIG. 14 shows an example of a transistor structure as the semiconductor device of this embodiment. The transistor includes a gate electrode 10, a gate insulating film 20, an oxide semiconductor layer 30, sidewalls 40, and source/drain electrodes (contacts) 50. The oxide semiconductor layer 30 is of the P type. The P-type oxide semiconductor layer 30 is, for example, a ZnO layer, a ZnAlO layer, a ZnCuO layer, a NiO layer, a SnO layer, and a $Cu_2O$ layer, each layer having impurities doped therein. The source/drain electrode 50 may have a double-layered structure as shown in the figure. In that case, the source/drain electrode 50 includes a first layer 50a in contact with the oxide semiconductor layer 30, and a second layer 50b provided over the first layer 50a. As long as the source/drain electrode 50 can be in ohmic contact with the oxide semiconductor layer 30, the first layer 50a may be thin. Suitable materials for the source/drain electrode 50 will be described later.

When the above transistor is applied to the respective embodiments, the components of the transistor will correspond to the elements of the respective embodiments as follows. The gate electrode 10 corresponds to the gate electrode 210 or 310. The gate insulating film 20 corresponds to the cap insulating layer 171 (or 171+220, or 171+320). The oxide semiconductor layer 30 corresponds to the oxide semiconductor layer 230 or 330. The sidewall 40 corresponds to the sidewall 240 or 340. The source/drain electrode 50 corresponds to the contact 289 or 389. This figure omits the illustration of the hard masks 232 and 332.

In the above first to fourth embodiments, active elements (wiring active elements) are provided in the wiring layer. In this case, in order to form all or a part of the circuit using the wiring active elements, it is necessary to provide an N-type wiring active element and a P-type wiring active element. The N-type wiring active element can be, for example a wiring active element using InGaZnO as a channel. The P-type wiring active element can be formed of for example, SnO. In order to achieve the P-type wiring active element, an oxide semiconductor having P-type conductivity is required but is a wide-gap semiconductor mainly having a band gap of 2 eV or more. In general, the wide-gap semiconductor has a conduction band end positioned at around 4 eV in depth as viewed from a vacuum level, and a valance band end positioned at 6 to 7.5 eV. In contrast, normal metal has a work function of about 3.8 to 5.65 eV. Thus, the contact between P-type wide-gap semiconductor and the metal causes the Schottky barrier. In contrast, the formation of Ohmic contact between the P-type semiconductor and the metal for contact is very important in the P-type field-effect transistor using the wide-gap semiconductor or a device using a P/N junction so as to reduce a parasitic resistance of the device.

Patent Documents 2 and 3 disclose a P-type field-effect transistor using a P-type oxide semiconductor SnO. The transistor includes the P-type oxide semiconductor SnO formed as a channel over a YSZ substrate, an a-$Al_2Ox$ formed thereover as a gate insulating film, and a metal lamination of Ni and Au formed as a source/drain electrode and a gate electrode. Non-Patent Document 4 discloses a P-type field-effect transistor using a P-type oxide semiconductor SnO. The transistor includes a SiNx layer formed as a gate insulating film over an $n^+$-type Si substrate also serving as a gate electrode, a P-type oxide semiconductor SnO formed thereover as a channel, and a Pt metal formed as a source/drain electrode in contact with the SnO.

The field-effect transistors disclosed in the above Patent Document 2, Non-Patent Document 3, and Non-Patent Document 4 use Ni, Au, or Pt whose work function is more than 5 eV as metal, to reduce a contact resistance against the P-type oxide semiconductor SnO. However, the inventors have further studied and just found the following facts. That is, when using the above metal as metal for contact with the P-type oxide semiconductor, a large contact resistance, or a parasitic resistance is caused between the metal for contact and the P-type oxide semiconductor due to the Schottky barrier, which interrupts the measurement of various properties of the P-type semiconductor. Thus, the development and achievement of the material and process for minimizing the contact resistance between the contact metal and the P-type oxide semiconductor becomes an important issue.

In this embodiment, the contact metal coupling to the P-type oxide semiconductor layer 30 is formed of a conductive oxide. That is, a material for at least the first layer 50a of the source/drain electrode 50 for use is a conductive oxide. The conductive oxide has a valance band positioned in the substantially same position as the valance band of the P-type oxide semiconductor, which is preferable for forming an Ohmic contact. This arrangement can reduce the contact resistance to the P-type oxide semiconductor. Material for the second layer 50b may be the same as that of the first layer 50a, or may be other conductive oxides or metal to make the Ohmic contact with the first layer 50a.

Suitable materials for the conductive oxide as the contact metal include, for example, indium oxide (ITO), ruthenium oxide ($RuO_2$), titanium oxide (TiOx), an oxygen-deficient oxide semiconductor, an oxide semiconductor doped with metal, and the like. The oxide semiconductors in this case can be used as the channel, and include various kinds of oxide semiconductors with different degrees of oxygen deficiency, with different kinds of metals, or with different degrees of doping. The oxide semiconductor preferably has a valance band deeper than that of the P-type oxide semiconductor, and more preferably deeper than that of the oxide semiconductor 30.

Material for contact with the N-type oxide semiconductor for use can be metal and not the above conductive oxide. Thus, in the circuit (for example, of the first to fourth embodiments) using both the N-type wiring active element and the P-type wiring active element, the N-type and P-type wiring active elements use different materials for contact.

In manufacturing the semiconductor device of this embodiment, the following method will be proposed. That is, in manufacturing the circuit using both the N-type wiring active element and the P-type wiring active element, separated production processes are introduced for formation of the contacts. Specifically, for example, in the first to fourth embodiments, in the step shown in FIG. 3K, an N-type oxide semiconductor layer side is subjected to masking by a hard mask upon forming the source/drain electrode in the P-type oxide semiconductor layer. Likewise, a P-type oxide semiconductor layer side is subjected to masking by a hard mask upon forming the source/drain electrode in the N-type oxide semiconductor layer. In use of a laminated structure of the first layer 50a and the second layer 50b as the source/drain electrode 50, a laminated film including a film for the first layer 50a and another film for the second layer 50b is formed.

Figure 15:
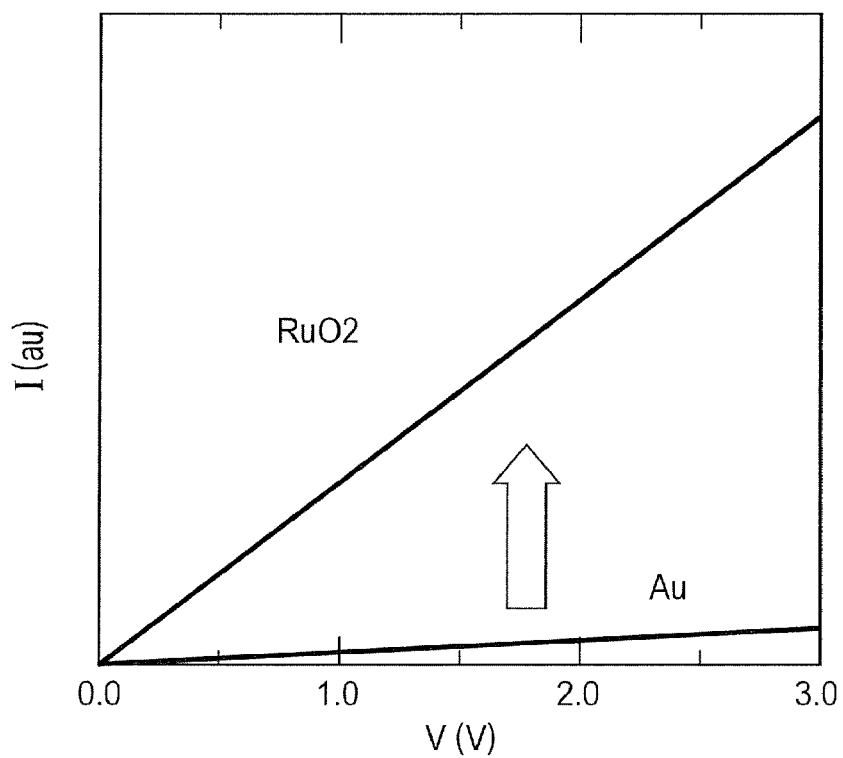
FIG. 15 is a graph showing contact characteristics between a material for a contact and an oxide semiconductor layer.

FIG. 15 is a graph showing the characteristics of contact between the contact material and the oxide semiconductor layer. In the figure, a longitudinal axis indicates a current flowing between the contact material and the oxide semiconductor layer (for example, SnO), and a horizontal axis indicates a voltage between the contact material and the oxide semiconductor layer. As shown in the figure, when using gold (Au) as the material for contact, the current is proportional to the voltage, but the contact resistance is so large that the current is low. This is due to the influence of the Schottky barrier. In contrast, when using ruthenium oxide ($RuO_2$) as the contact material, which is one of the conductive oxides, the current is proportional to the voltage. As compared to the use of Au, the contact resistance is small, and the current is large at the same voltage. That is, the use of the ruthenium oxide can exhibit good Ohmic contact whose contact resistance is small. In this case, one layer of ruthenium oxide ($RuO_2$) is used as the source/drain electrode 50.

The structure of this embodiment uses the conductive oxide for formation of contact to the P-type oxide semiconductor layer 30, which can align the valance band by the band structure of the oxides. Thus, this embodiment can form the Ohmic contact with the P-type oxide semiconductor layer.

Such a conductive oxide can be applied to the wide-gap semiconductor (for example, GaN, SiC) having a band gap of 2 eV or more.

Sixth Embodiment

Figure 16:
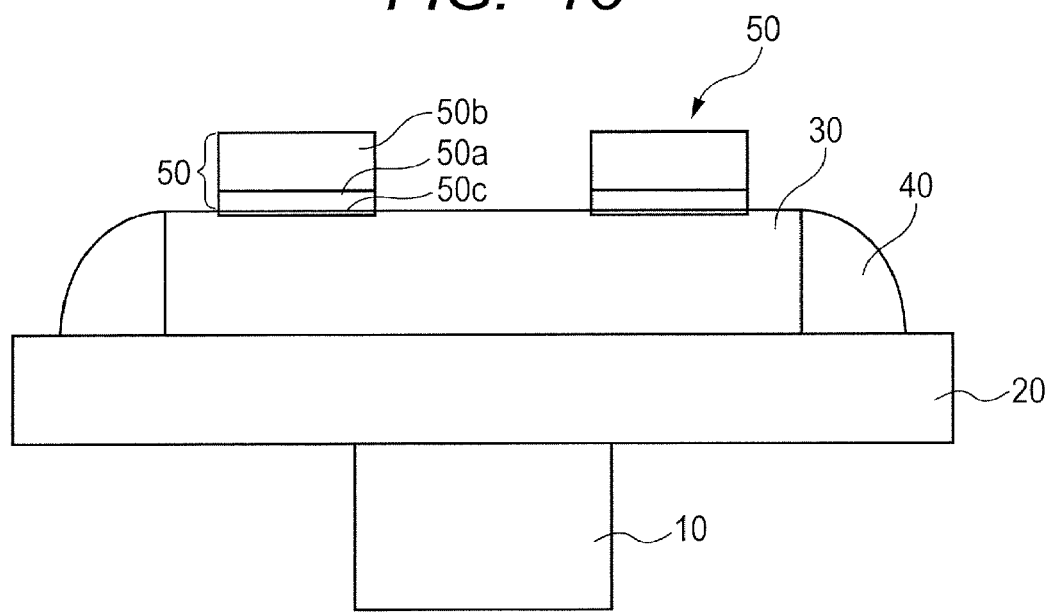
FIG. 16 is a cross-sectional view showing the structure of a semiconductor device according to a fifth embodiment of the invention.

The structure of a semiconductor device in a sixth embodiment of the invention will be described below. FIG. 16 shows a cross-sectional view of the semiconductor device structure in this embodiment. The semiconductor device of this embodiment differs from the semiconductor device of the fifth embodiment in the use of an interface layer 50c as the source/drain electrode (contact). Now, the differences will be mainly described.

In this embodiment, as the material for the source/drain electrode 50 (at least first layer 50a) is the material for forming an interface layer 50c with respect to the oxide semiconductor of the oxide semiconductor layer 30. The material can include metal, such as titanium (Ti). When such a material is used to form the source/drain electrode (contact), the interface layer 50c that can reduce the Schottkey effect or can form the Ohmic contact is formed at an interface between the source/drain electrode 50 and the oxide semiconductor layer 30. This embodiment can achieve the reduction in contact resistance to the P-type oxide semiconductor layer 30.

For example, the contact of the above material (for example, metal, such as Ti) with the P-type oxide semiconductor (for example, SnO) will cause the following phenomena. At the contacting part, the material pulls a small amount of oxygen from the oxide semiconductor, and slightly reduces the oxide semiconductor. As a result, a modified metal layer (metallic layer) is formed (for example, of Sn) on the oxide semiconductor side by reduction. In contrast, on the material side, a metal oxide layer (for example, TiOx) is formed by the oxidation of the pulled oxygen. Such an interface structure causes a mechanism, for example, suppresses the depletion of the oxide semiconductor to reduce band vending, which reduces the Schottky effect. Thus, such a material is suitable for forming the Ohmic contact. In this case, the interface layer 50c can be regarded as the interface structure including both the modified metal layer and the metal oxide layer.

That is, the interface layer 50c can be regarded as the layer formed by reaction between the material of the source/drain electrode and the material of the oxide semiconductor layer. Specifically, for example, the interface layer 50c can also be regarded as the layer formed by diffusing one or both of a part of elements of the material of the source/drain electrode and a part of elements of the material of the oxide semiconductor to each other to partly modify the source/drain electrode or the oxide semiconductor. Alternatively, the interface layer 50 may be regarded as a gradational layer whose composition gradually changes. The interface layer 50c may be positioned on the source/drain electrode side, or on the oxide semiconductor side, or on both sides thereof.

The semiconductor device of this embodiment can be manufactured by the same method as in the fifth embodiment. In this case, material for forming the interface layer 50c with respect to the above oxide semiconductor can be used as the material for contact. If necessary, heat treatment or the like may be performed to promote the formation of the interface layer 50.

Figure 17:
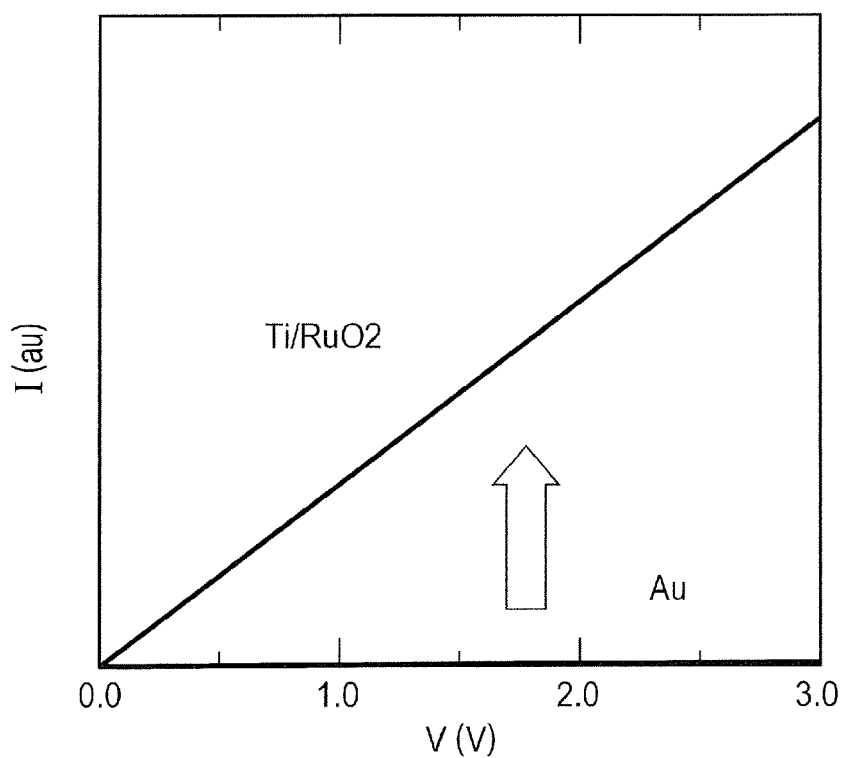
FIG. 17 is a graph showing contact characteristics between the material for a contact and another oxide semiconductor layer.

FIG. 17 is a graph showing the characteristics of contact between the contact material and the oxide semiconductor layer. In the figure, a longitudinal axis indicates a current flowing between the contact material and the oxide semiconductor layer (for example, SnO), and a horizontal axis indicates a voltage between the contact material and the oxide semiconductor layer. As shown in the figure, when using gold (Au) as the material for contact, the current is proportional to the voltage, but the contact resistance is so large that the current is low. This is due to the influence of the Schottky barrier. In contrast, when using titanium (Ti)/ruthenium oxide ($RuO_2$), which is one of the conductive oxides, as the contact material, the current is proportional to the voltage, and the contact resistance is so small that the current is high even at the same voltage. That is, this embodiment can have the small contact resistance and good Ohmic contact. In this case, a two-layered structure including the first layer 50a of titanium (Ti) and the second layer 50b of ruthenium oxide ($RuO_2$) is used as the source/drain electrode 50. The interface layer 50c is formed at a boundary between the titanium (Ti) and the oxide semiconductor layer (SnO).

In the structure of this embodiment, the interface layer 50c is introduced into a contacting part to the P-type oxide semiconductor layer 30, which can reduce the Schottoky effect by reduction of the oxides or the like. Thus, this embodiment can form the Ohmic contact with the P-type oxide semiconductor layer. Such a conductive oxide can also be applied to the wide-gap semiconductor (for example, GaN, SiC) having a band gap of 2 eV or more.

Seventh Embodiment

The structure of a semiconductor device in a seventh embodiment of the invention will be described below. The semiconductor device of this embodiment differs from the semiconductor device of the sixth embodiment in the use of the same material to form the source/drain electrodes for the N-type oxide semiconductor and the P-type oxide semiconductor. Now, the differences will be mainly described.

In the CMOS structure of this embodiment, by way of example, InGaZnO is used as the N-type oxide semiconductor layer 30 serving as an N-type field-effect transistor (NFET) channel, and SnO is used as the P-type oxide semiconductor layer 30 serving as a P-type field-effect transistor (PFET) channel. The source/drain electrode 50 for either the InGaZnO of the N-type oxide semiconductor layer 30 or the SnO of the P-type oxide semiconductor layer 30 uses titanium (Ti)/aluminum (Al) or aluminum alloy (AlCu) in manufacturing. In this case, the first layer 50a is made of titanium (Ti), and the second layer 50b is made of aluminum (Al) or an aluminum alloy (AlCu).

The semiconductor device of this embodiment can be manufactured by the same method as in the first to fourth embodiments. The manufacturing method of the semiconductor device in this embodiment does not need the individual manufacturing processes in formation of the contact unlike the fifth and sixth embodiments. The source/drain electrode 50 for each of the N-type oxide semiconductor layer 30 and the P-type oxide semiconductor layer 30 uses titanium (Ti)/aluminum (Al) in manufacturing.

Figure 18:
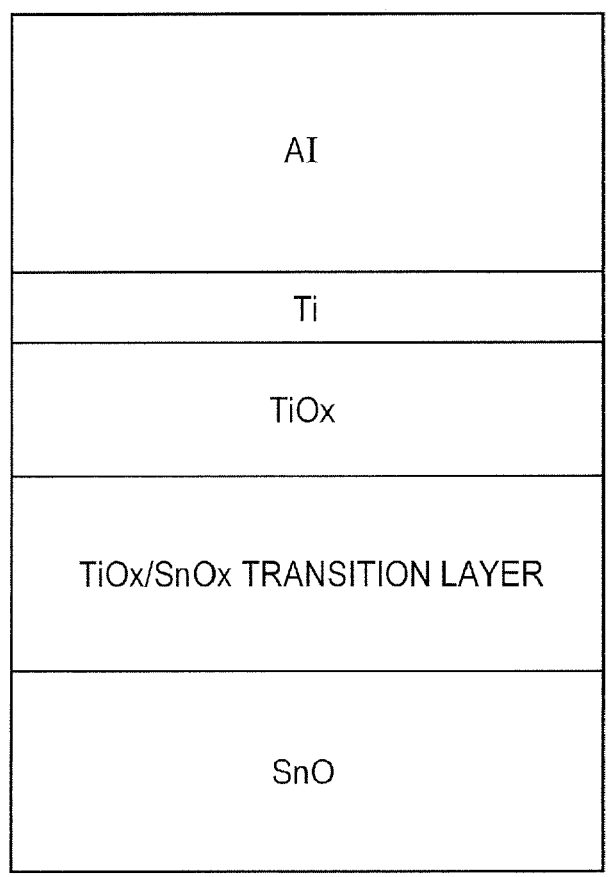
FIG. 18 is a schematic cross-sectional view showing a composition of an interface between a P-type oxide semiconductor layer and a source/drain electrode of the semiconductor device in this embodiment.

In this case, the inventors have studied and got the following facts. After manufacturing the semiconductor device, Ti of Ti/Al keeps metallic at an interface between InGaZnO of the N-type oxide semiconductor layer 30 and Ti of the first layer 50a. That is, the interface layer 50c can be formed of Ti, which is the same as that of the first layer 50a. This embodiment can achieve the low resistance contact to InGaZnO. In contrast, the interface between SnO of the P-type oxide semiconductor layer 30 and Ti of the first layer 50a will be as follows. FIG. 18 shows a schematic cross-sectional view of the composition of an interface between the P-type oxide semiconductor layer and the source/drain electrode of the semiconductor device in this embodiment. This figure shows the interface evaluated by an XPS (x-ray photoelectron spectroscopy). As shown in the figure, at the interface between the P-type oxide semiconductor layer 30 (SnO) and the source/drain electrode 50 (Ti/Al), Ti positioned on the SnO side of Ti/Al partially draws oxygen from SnO to reduce the resistance of the SnO, and is oxidized itself to become TiOx. The interface layer 50c can be a TiOx/SnOx transition (x<1) unlike the first layer 50a. In the TiOx/SnOx transition layer, the ratio of TiOx to SnOx and the oxidation number gradually changes, which leads to the reduction of SnO and the coexistence of TiOx and SnOx. On the side of the TiOx/SnOx closer to Ti, TiOx is dominant. The compound TiOx is effective to reduce the contact resistance to the P-type oxide semiconductor like the sixth embodiment. The above process can reduce the contact resistance to SnO.

Figure 19:
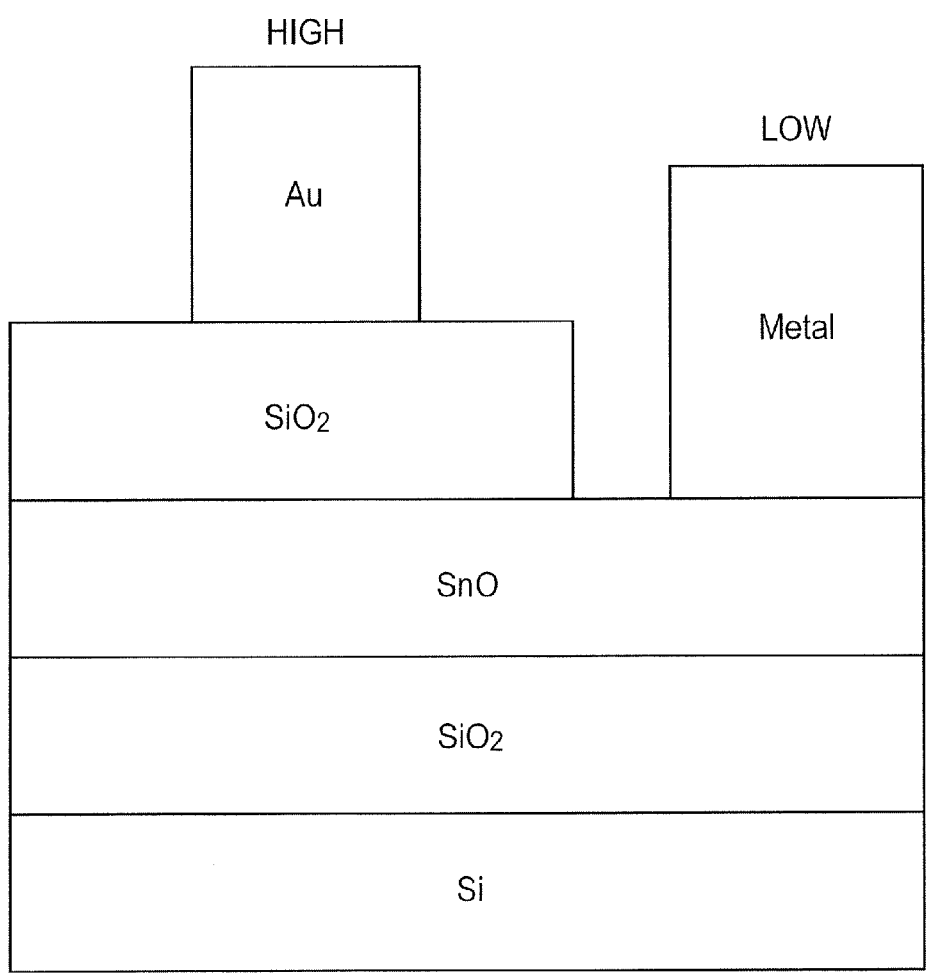
FIG. 19 is a cross-sectional view showing an element for measuring the properties of the semiconductor device in this embodiment.

The above contact materials are evaluated as follows. FIG. 19 shows a cross-sectional view of an element structure for measuring the properties of the semiconductor device in this embodiment. In order to evaluate the properties of the contact materials, the CV characteristics are measured based on the element structure shown in the figure. The element structure includes a SnO film (of 100 nm in thickness) formed as the P-type oxide semiconductor over a Si substrate with a $SiO_2$ film attached thereto, and a $SiO_2$ film (of 50 nm in thickness) formed as a gate insulating film over the SnO film. An Au film is provided as one gate electrode over the gate insulating film, and a film (of metal) of the contact material of this embodiment is provided as the other electrode over the SnO film.

Figure 20:
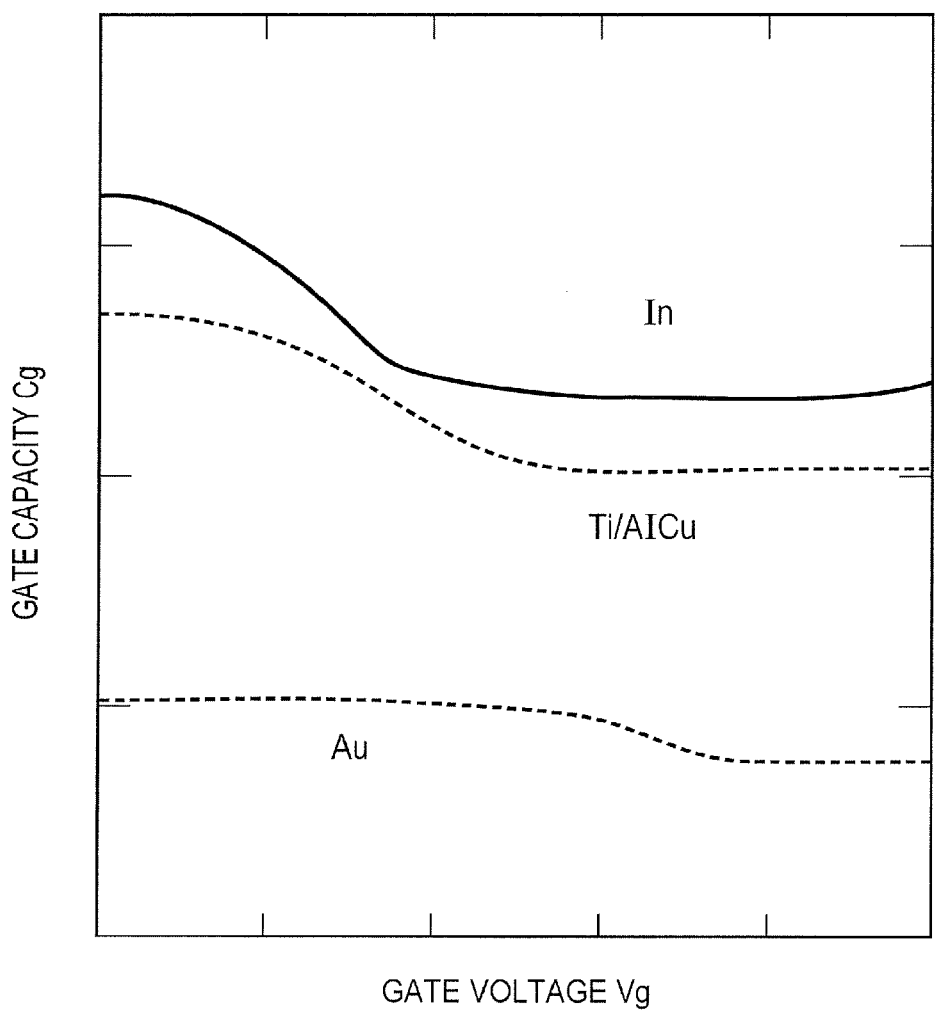
FIG. 20 is a graph showing the properties of the semiconductor device in this embodiment.

FIG. 20 shows a graph of the properties (evaluation results) of the semiconductor device in this embodiment. In FIG. 19, a longitudinal axis indicates a capacity, and a horizontal axis indicates a voltage. As shown in the figure, the use of the Ti (first layer 50a)/AlCu (second layer 50b) as the film of the contact material (Metal) can increase the capacity C as compared to the used of an Au (gold) film. This is because a component of the contacting part contributing to the parasitic resistance is reduced to restore the capacity C. The use of the In (ITO) which is an oxide conductor described in the fifth embodiment can also increase the capacity C for the same reason.

As mentioned above, in this embodiment, the same contact material is used for the N-type oxide semiconductor and the P-type oxide semiconductor in manufacturing, but is found to become the different kinds of contact materials in checking the properties after manufacturing of the semiconductor device. That is, in this embodiment, the contact for the P-type oxide semiconductor is formed of the same material (for example, Ti) as that of the contact for the N-type oxide semiconductor. However, as a result, the material of the contact for the P-type oxide semiconductor becomes different from that of the N-type oxide (for example, Ti versus TiOx). In other words, the material (for example, Ti) is used which exhibits different behaviors (for example, of Tia and TiOx) with respect to the different oxide semiconductors (for example, of InGaZnO and SnO). Without the individual manufacturing processes, the low resistance contacts (including the Ohmic contact to the P-type oxide semiconductor) can be formed for both the oxide semiconductors.

The fifth to seventh embodiments of the invention can be described as follows, but the invention is not limited thereto.
(Additional Statement 1)

The present invention provides a semiconductor device, including: a first transistor (200) of a first conductive type serving as one transistor forming a CMOS; and a second transistor (300) of a second conductive type other than the first conductive type, serving as another transistor forming the CMOS, wherein the first transistor (200) and the second transistor (300) differ from each other in material or property of the source/drain electrodes (289 and 389).
(Additional Statement 2)

In the semiconductor device described in the additional statement 1, each of the first transistor (200) and the second transistor includes:

a gate electrode (210/310);

a gate insulating film (171) formed over the gate electrode (210, 310);

an oxide semiconductor layer (230/330) formed over the gate insulating film (171); and a source/drain electrode (289/389) formed over the oxide semiconductor layer (230/330), wherein the source/drain electrode (289/389) for a P-type transistor which is one of the first transistor (200) and the second transistor (300) has a contacting part with the oxide semiconductor (230/330) as a P-type oxide semiconductor layer of the P-type transistor, the contacting part containing a conductive oxide or another P-type oxide semiconductor.
(Additional Statement 3)

In the semiconductor device described in the additional statement 2, the contacting part contains at least one material selected from the group comprised of ruthenium oxide, tin-doped indium oxide, and titanium oxide.
(Additional Statement 4)

In the semiconductor device described in the additional statement 1, each of the first transistor (200) and the second transistor includes:

a gate electrode (210/310);

a gate insulating film (171) formed over the gate electrode (210, 310);

an oxide semiconductor layer (230/330) formed over the gate insulating film (171); and a source/drain electrode (289/389) of the oxide semiconductor layer (230/330), wherein the source/drain electrode (289/389) for a P-type transistor which is one of the first transistor (200) and the second transistor (300) has a contacting part with the oxide semiconductor layer (230/330) as a P-type oxide semiconductor layer of the P-type transistor, the contacting part containing metal for forming an interface layer (50c) formed by partially modifying at least one of the oxide semiconductor layer and the source/drain electrode (289/389).
(Additional Statement 5)

In the semiconductor device described in the additional statement 4, the contacting part contains titanium oxide.
(Additional Statement 6)

In the semiconductor device described in the additional statement 5, wherein the source/drain electrode (289/389) for an N-type transistor which is the other of the first transistor (200) and the second transistor (300) has a contacting part with the oxide semiconductor layer (230/330) as an N-type oxide semiconductor layer of the N-type transistor, the contacting part containing titanium.

The present invention made by the inventors has been specifically described based on the preferred embodiments, but it is apparent that the invention is not limited thereto, and that various modifications and changes can be made without departing from the scope of the invention. The respective preferred embodiments and techniques of the modified examples of the embodiments can also be applied to other embodiments as long as they are not technically contradictory.

What is claimed is:

1. A method for manufacturing a semiconductor device, comprising the steps of:

forming a cap insulating layer serving as a first gate insulating film and a second gate insulating film, over a first wiring layer having a first wiring formed therein as each of a first gate electrode and a second gate electrode in contact with the first gate electrode and the second gate electrode;

forming a first laminated structure of a first oxide semiconductor layer of a first conductive type and a first hard mask layer, over the first gate electrode via the cap insulating layer;

forming an insulating film to cover the first laminated structure and the cap insulating layer;

forming a first sidewall film to cover a side of the first oxide semiconductor layer by etching back the insulating film;

forming a second laminated structure of a second oxide semiconductor layer of a second conductive type other than the first conductive type and a second hard mask layer, over the second gate electrode via the cap insulating layer;

forming an interlayer insulating layer to cover the first laminated structure and the second laminated structure; and forming source/drain electrodes coupled to the first oxide semiconductor layer and the second oxide semiconductor layer via the interlayer insulating layer, the first hard mask, and the second hard mask.

2. The manufacturing method of the semiconductor device according to claim 1, wherein the first laminated structure and the second laminated structure differ from each other in material or property of the source/drain electrode.

3. The manufacturing method of the semiconductor device according to claim 2,
wherein one of the first oxide semiconductor layer and the second oxide semiconductor layer is a P-type oxide semiconductor layer, and
wherein the source/drain electrode has a contacting part to the P-type oxide semiconductor layer, said contacting part containing a conductive oxide or another P-type oxide semiconductor.

4. The manufacturing method of the semiconductor device according to claim 2,
wherein one of the first oxide semiconductor layer and the second oxide semiconductor layer is a P-type oxide semiconductor layer, and
wherein the source/drain electrode has a contacting part to the P-type oxide semiconductor layer, said contacting part being adapted to contain metal for forming an interface layer by partially modifying at least one of the P-type oxide semiconductor layer and the source/drain electrode.

* * * * *